United States Patent
Kim et al.

(10) Patent No.: US 12,490,639 B2
(45) Date of Patent: Dec. 2, 2025

(54) DISPLAY DEVICE AND METHOD OF MANUFACTURING THE SAME

(71) Applicant: Samsung Display Co., LTD., Yongin-si (KR)

(72) Inventors: Jooil Kim, Cheonan-si (KR); Kwangrae Lee, Seoul (KR); Myoung-Ha Jeon, Asan-si (KR); Sujin Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 654 days.

(21) Appl. No.: 17/659,291

(22) Filed: Apr. 14, 2022

(65) Prior Publication Data
US 2022/0344618 A1    Oct. 27, 2022

(30) Foreign Application Priority Data
Apr. 22, 2021    (KR) .......................... 10-2021-0052447

(51) Int. Cl.
*H10K 59/12* (2023.01)
*H10K 59/80* (2023.01)
*H10K 77/10* (2023.01)
*H10K 102/00* (2023.01)

(52) U.S. Cl.
CPC ......... *H10K 59/8791* (2023.02); *H10K 59/12* (2023.02); *H10K 59/1201* (2023.02); *H10K 59/8731* (2023.02); *H10K 77/111* (2023.02); *H10K 2102/311* (2023.02)

(58) Field of Classification Search
CPC ........... H10K 50/868; H10K 2102/311; H10K 59/12; H10K 102/00; G09F 9/301
See application file for complete search history.

(56) References Cited

U.S. PATENT DOCUMENTS

| | | | |
|---|---|---|---|
| 2018/0246544 A1* | 8/2018 | Kwon ................. | H10K 77/111 |
| 2019/0318689 A1* | 10/2019 | Kim ..................... | H05K 1/0281 |
| 2022/0238048 A1* | 7/2022 | Gao ....................... | H10K 59/87 |

FOREIGN PATENT DOCUMENTS

| | | |
|---|---|---|
| KR | 10-2018-0035982 A | 4/2018 |
| KR | 10-2019-0037600 A | 4/2019 |
| KR | 10-2019-0119244 A | 10/2019 |
| KR | 10-2020-0110494 A | 9/2020 |

* cited by examiner

*Primary Examiner* — William B Partridge
*Assistant Examiner* — Felix B Andrews
(74) *Attorney, Agent, or Firm* — Womble Bond Dickinson (US) LLP

(57) ABSTRACT

A display device includes: a display panel having a first area, a second area spaced apart from the first area in a first direction, and a bending area between the first area and the second area; a polarization layer in the first area on the display panel; and a bending protection layer on the display panel and including: a pre-formed bending protection layer spaced apart from the polarization layer in the first direction; a first post-formed bending protection layer between the polarization layer and the pre-formed bending protection layer; and a second post-formed bending protection layer spaced apart from the first post-formed bending protection layer with the pre-formed bending protection layer interposed therebetween.

12 Claims, 17 Drawing Sheets

DISPLAY DEVICE AND METHOD OF MANUFACTURING THE SAME

CROSS-REFERENCE TO RELATED APPLICATION

The present application claims priority to and the benefit of Korean Patent Application No. 10-2021-0052447, filed on Apr. 22, 2021, which is hereby incorporated by reference for all purposes as if fully set forth herein.

BACKGROUND

1. Field

Embodiments of the present inventive concept relate to a display device and method of manufacturing the same.

2. Description of the Related Art

Flat panel display devices are replacing cathode ray tube display devices as display devices due to their lightweight and thin characteristics. As representative examples of such flat panel display devices, there are liquid crystal display devices and organic light emitting element display devices.

At least a portion of the display device may be bent. Therefore, a visibility of the display device from various angles may be improved, and an area of a non-display region may be decreased. In a method of manufacturing the display device in which at least a portion thereof is bent, methods for minimizing or reducing damage and manufacturing cost have been studied.

The above information disclosed in this Background section is only for enhancement of understanding of the background and therefore the information discussed in this Background section does not necessarily constitute prior art.

SUMMARY

Aspects of some embodiments of the present inventive concept relate to a display device and a method of manufacturing the same. For example, aspects of some embodiments of the present inventive concept relate to a display device having a bending area and method of manufacturing the same.

Aspects of some embodiments of the present inventive concept include a display device with relatively improved reliability.

Aspects of some embodiments of the present inventive concept also provide a method of manufacturing the display device with improved reliability.

Additional features of some embodiments of the inventive concept will be set forth in the description which follows, and in part will be apparent from the description, or may be learned by practice of the inventive concepts.

A display device according to some embodiments may include a display panel having a first area, a second area spaced apart from the first area in a first direction, and a bending area positioned between the first area and the second area, a polarization layer in the first area on the display panel, and a bending protection layer on the display panel and including a pre-formed bending protection layer, a first post-formed bending protection layer, and a second post-formed bending protection layer. The pre-formed bending protection layer may be spaced apart from the polarization layer in the first direction. The first post-formed bending protection layer may be positioned between the polarization layer and the pre-formed bending protection layer. The second post-formed bending protection layer may be spaced apart from the first post-formed bending protection layer with the pre-formed bending protection layer interposed therebetween.

According to some embodiments, at least a portion of the pre-formed bending protection layer may overlap the bending area.

According to some embodiments, at least a portion of the first post-formed bending protection layer may overlap the first area. At least a portion of the second post-formed bending protection layer may overlap the second area.

According to some embodiments, the first post-formed bending protection layer may directly contact the polarization layer and the pre-formed bending protection layer. The second post-formed bending protection layer may directly contact the pre-formed bending protection layer.

According to some embodiments, the pre-formed bending protection layer, the first post-formed bending protection layer, and the second post-formed bending protection layer may include a same material.

According to some embodiments, an average distance between a lower surface of the display panel and an upper surface of the bending protection layer may be less than an average distance between the lower surface of the display panel and an upper surface of the polarization layer.

According to some embodiments, the pre-formed bending protection layer may extend in a second direction crossing the first direction.

According to some embodiments, an edge of the first post-formed bending protection layer contacting the pre-formed bending protection layer may extend in the second direction. An edge of the second post-formed bending protection layer contacting the pre-formed bending protection layer may extend in the second direction, and may be spaced apart from the edge of the first post-formed bending protection layer in the first direction.

A method of manufacturing a display device according to some embodiments may include forming a display panel having a first area, a second area spaced apart from the first area in a first direction, and a bending area positioned between the first area and the second area, forming a polarization layer in the first area on the display panel, forming a pre-formed bending protection layer on the display panel, and forming a post-formed bending protection layer including a first post-formed bending protection layer and a second post-formed bending protection layer on the display panel. The pre-formed bending protection layer may be formed to be spaced apart from the polarization layer in the first direction. The first post-formed bending protection layer may be formed between the polarization layer and the pre-formed bending protection layer. The second post-formed bending protection layer may be formed to be spaced apart from the first post-formed bending protection layer with the pre-formed bending protection layer interposed therebetween.

According to some embodiments, the forming of the pre-formed bending protection layer may include forming a first curable material layer on the display panel by applying a first curable material to a first forming area spaced apart from the polarization layer in the first direction, and forming the pre-formed bending protection layer by pre-curing the first curable material layer.

According to some embodiments, the forming of the post-formed bending protection may include forming a second curable material layer and a third curable material layer on the display panel by applying a second curable material to a second forming area and a third forming area, and forming the first post-formed bending protection layer and the second post-formed bending protection layer by curing the second curable material layer and the third curable material layer. The second forming area may be positioned between the polarization layer and the first forming area. The third forming area may be adjacent to the first forming area in the first direction According to some embodiments, the third curable material layer may be formed before the second curable material layer.

According to some embodiments, the second curable material may be same as the first curable material.

According to some embodiments, the third curable material layer may be spaced apart from the second curable material layer with the pre-formed bending protection layer interposed therebetween.

According to some embodiments, at least a portion of the pre-formed bending protection layer may overlap the bending area.

According to some embodiments, at least a portion of the first post-formed bending protection layer may overlap the first area. At least a portion of the second post-formed bending protection layer may overlap the second area.

According to some embodiments, the first post-formed bending protection layer may directly contact the polarization layer and the pre-formed bending protection layer. The second post-formed bending protection layer may directly contact the pre-formed bending protection layer.

According to some embodiments, an average distance between a lower surface of the display panel and an upper surface of a bending protection layer including the pre-formed bending protection layer and the post-formed bending protection layer may be less than an average distance between the lower surface of the display panel and an upper surface of the polarization layer.

According to some embodiments, the pre-formed bending protection layer may extend in a second direction crossing the first direction.

According to some embodiments, an edge of the first post-formed bending protection layer contacting the pre-formed bending protection layer may extend in the second direction. An edge of the second post-formed bending protection layer contacting the pre-formed bending protection layer may extend in the second direction, and may be spaced apart from the edge of the first post-formed bending protection layer in the first direction.

The display device according to some embodiments may include the display panel, the polarization layer on the display panel, and the bending protection layer on the display panel and covering the bending area. The bending protection layer may include the pre-formed bending protection layer spaced apart from the polarizing layer and the post-formed bending protection layer including the first and second post-formed bending protection layers on both sides of the pre-bending protection layer, respectively. The pre-formed bending protection layer may be formed before the post-formed bending protection layer. Accordingly, even when the bending protection layer has a relatively small thickness, a uniformity of the thickness of the bending protection layer may be improved. Accordingly, the reliability of the display device may be improved.

It is to be understood that both the foregoing general description and the following detailed description are merely examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Illustrative, non-limiting embodiments will be more clearly understood from the following detailed description in conjunction with the accompanying drawings.

Figure 1:
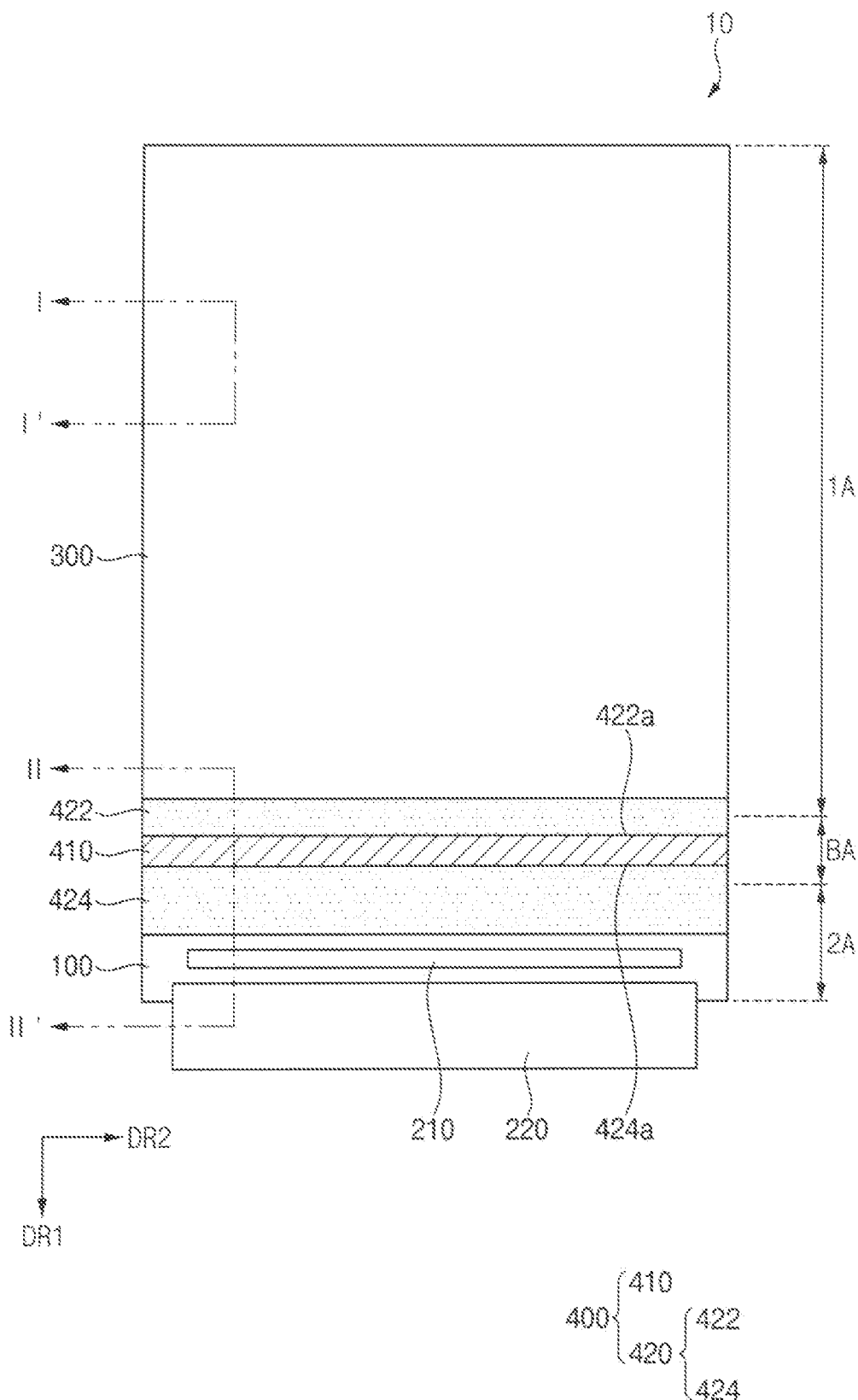
FIG. 1 is a plan view illustrating a display device according to some embodiments.
Figure 2:
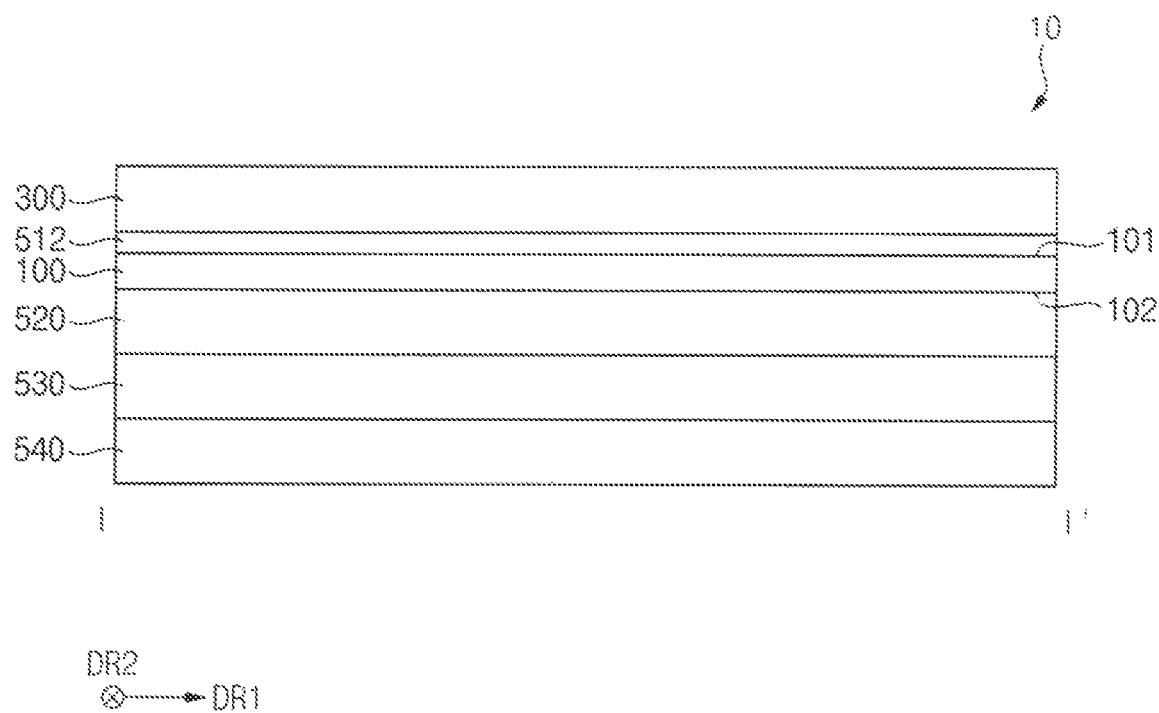
FIG. 2 is a cross-sectional view taken along the line I-I' of FIG. 1.
Figure 3:
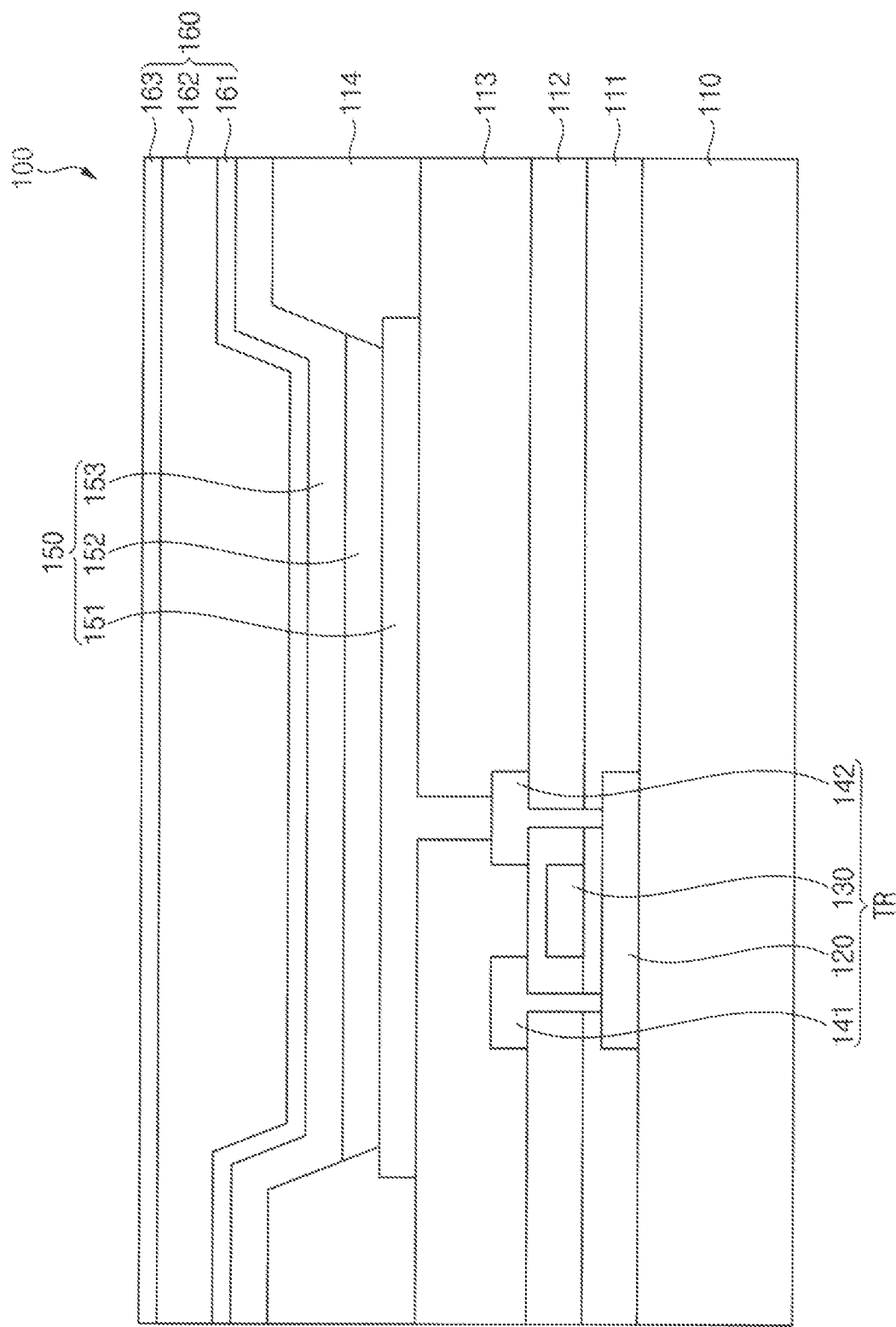
FIG. 3 is a cross-sectional view illustrating a display panel included in the display device of FIG. 2.
Figure 4:
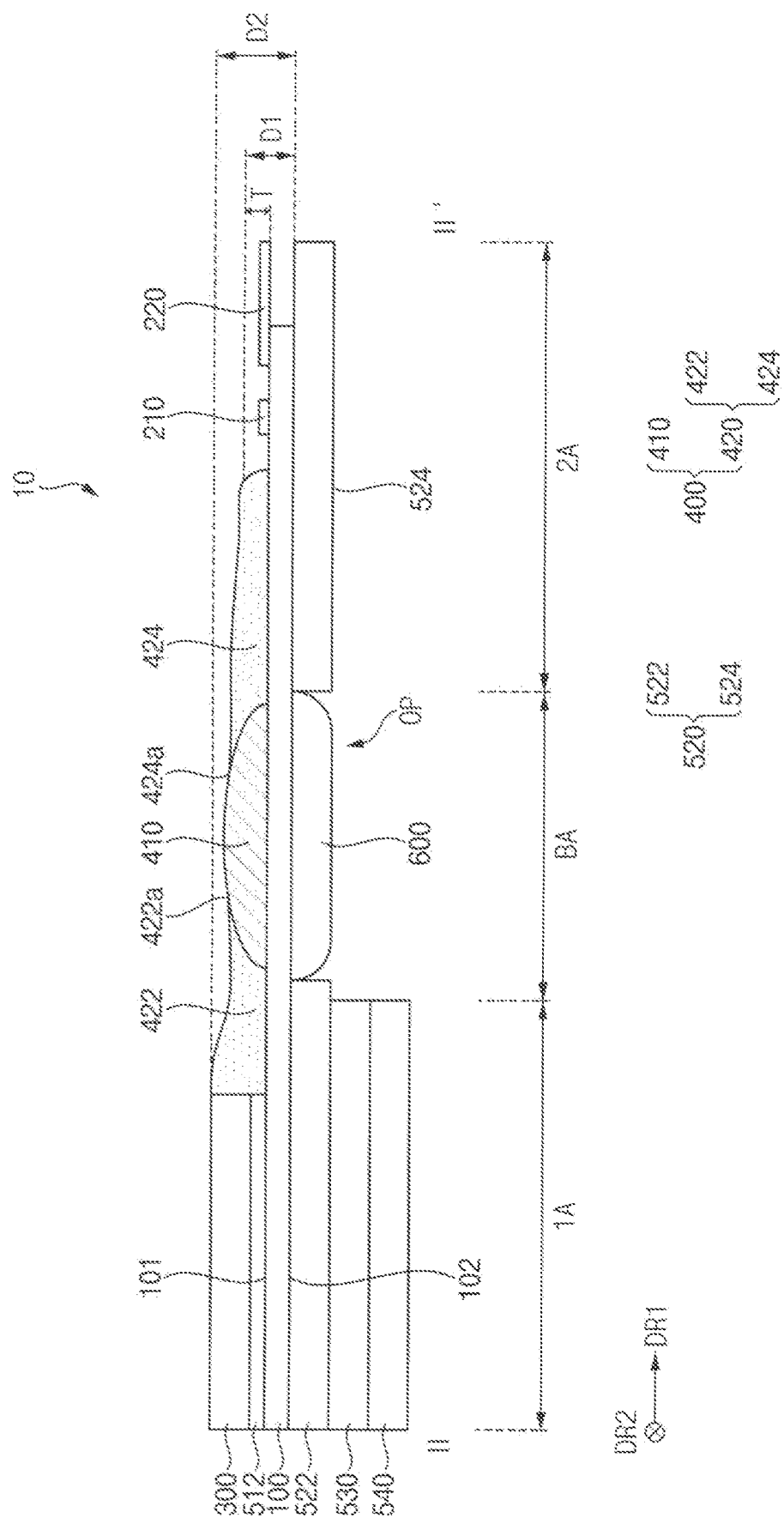
FIG. 4 is a cross-sectional view illustrating an example taken along the line II-II' of FIG. 1.
Figure 5:
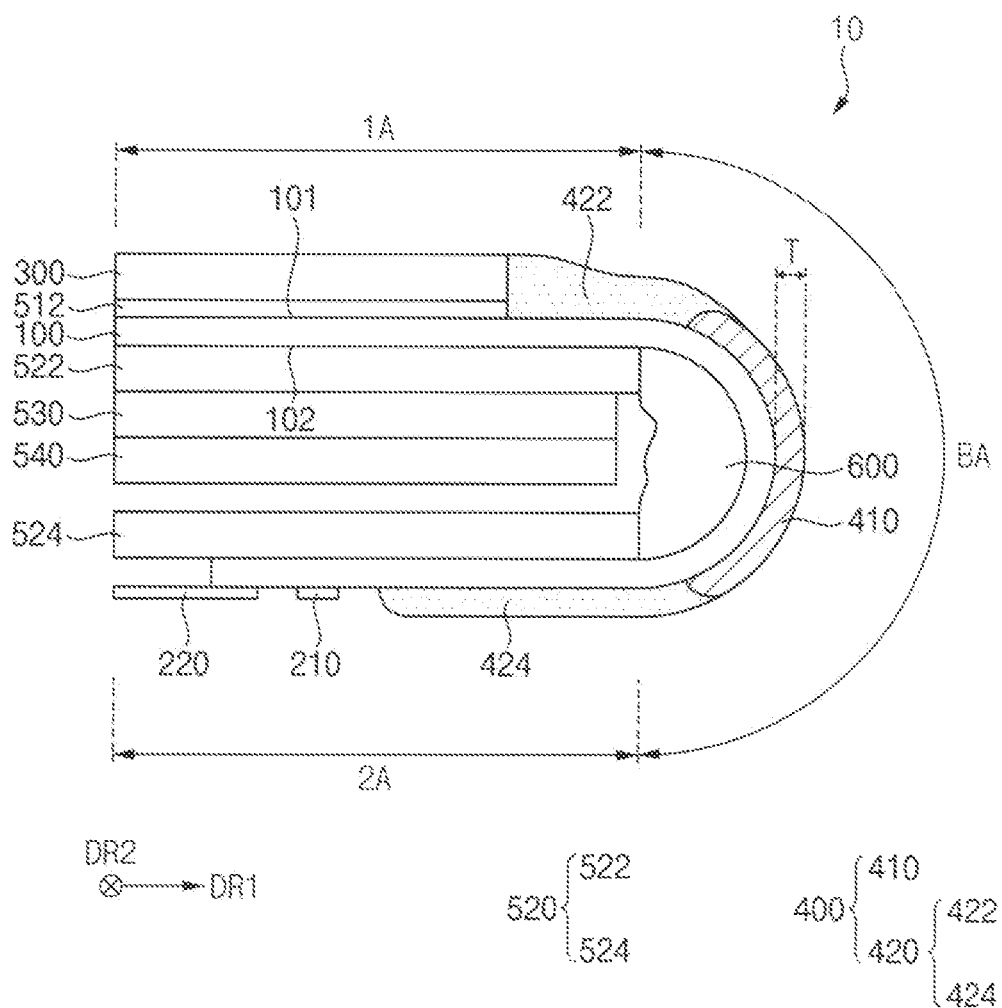
FIG. 5 is a cross-sectional view illustrating a bent configuration of the display device of FIG. 4.
Figure 6:
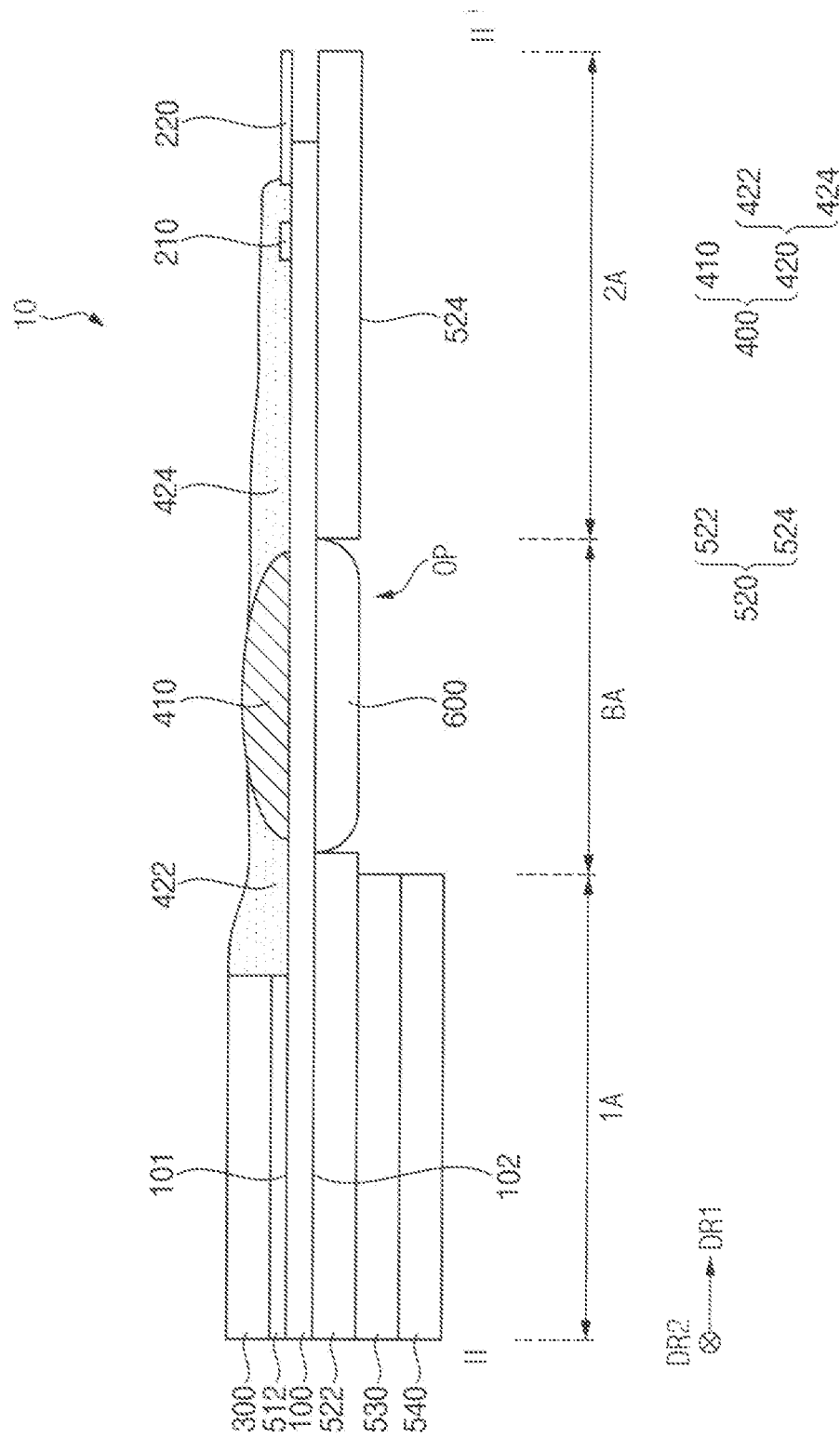
FIG. 6 is a cross-sectional view illustrating another example taken along the line II-II' of FIG. 1.

FIG. 1 is a plan view illustrating a display device according to some embodiments. FIG. 2 is a cross-sectional view taken along the line I-I' of FIG. 1. FIG. 3 is a cross-sectional view illustrating a display panel included in the display device of FIG. 2. FIG. 4 is a cross-sectional view illustrating an example taken along the line II-II' of FIG. 1. FIG. 5 is a cross-sectional view illustrating a bent configuration of the display device of FIG. 4. FIG. 6 is a cross-sectional view illustrating another example taken along the line II-II' of FIG. 1.

Referring to FIGS. 1 to 6, a display device 10 according to some embodiments may include a display panel 100, a driving circuit chip 210, a flexible printed circuit board ("FPCB") 220, a polarization layer 300, a bending protection layer 400, a panel protection layer 520, a cushion layer 530, and a metal layer 540.

The display panel 100 may generate or display images. The display panel 100 may include a plurality of pixels for generating the image. Light emitted from each of the pixels may be combined to generate or display images. The display panel 100 may provide the generated image toward an upper surface 101.

The display panel 100 may have a first area 1A, a second area 2A, and a bendable area in the form of a bending area BA. For example, the first area 1A may be a display area in which the images are displayed, and the second area 2A may be a non-display area.

According to some embodiments, the second area 2A may be positioned at a side of the first area 1A, and may be spaced apart from the first area 1A. For example, the second area 2A may be spaced apart from the first area 1A in a first direction DR1.

The bending area BA may be positioned between the first area 1A and the second area 2A. The bending area BA may be bent along a bending axis extending in a second direction DR2 crossing the first direction DR1. For example, the second direction DR2 may be perpendicular to the first direction DR1.

According to some embodiments, as illustrated in FIG. 3, the display panel 100 may include a substrate 110, a transistor TR, a light emitting element 150, and an encapsulation layer 160.

The substrate 110 may be a flexible and insulating substrate. For example, the substrate 110 may include (or, may be) a transparent resin substrate. For example, the substrate 110 may include a polyimide substrate. In this case, the substrate 110 may have a multi-layered structure in which one or more polyimide layer and one or more barrier layer are alternately stacked.

An active layer 120 may be located on the substrate 110. The active layer 120 may include an oxide semiconductor, a silicon semiconductor, an organic semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer 120 may include a source area, a drain area, and a channel area positioned between the source area and the drain area.

According to some embodiments, a buffer layer may be located between the substrate 110 and the active layer 120. The buffer layer may prevent or reduce instances of impurities diffusing into the active layer 120 from the substrate 110. The buffer layer may prevent or reduce penetration of foreign substances such as oxygen or moisture through the substrate 110 to the active layer 120. The buffer layer may include an inorganic insulating material such as a silicon compound, a metal oxide, or the like. Examples of the inorganic insulating material that can be used for the buffer layer may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer may have a single-layered structure or a multi-layered structure including a plurality of insulating layers.

A first insulating layer 111 may be located on the active layer 120. The first insulating layer 111 may cover the active layer 120 on the substrate 110. The first insulating layer 111 may include an inorganic insulating material such as a silicon compound, a metal oxide, or the like. The first insulating layer 111 may have a single-layered structure or a multi-layered structure including a plurality of insulating layers.

A gate electrode 130 may be located on the first insulating layer 111. The gate electrode 130 may overlap the channel area of the active layer 120. The gate electrode 130 may include a conductive material such as a metal, an alloy, a conductive metal nitride, a conductive metal oxide, a transparent conductive material, or the like. Examples of the conductive material that can be used for the gate electrode 130 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These can be used alone or in a combination thereof. The gate electrode 130 may have a single-layered structure or a multi-layered structure including a plurality of conductive layers.

A second insulating layer 112 may be located on the gate electrode 130. The second insulating layer 112 may cover the gate electrode 130 on the first insulating layer 111. The second insulating layer 112 may include an inorganic insulating material such as a silicon compound, a metal oxide, or the like. The second insulating layer 112 may have a single-layered structure or a multi-layered structure including a plurality of insulating layers.

A source electrode 141 and a drain electrode 142 may be located on the second insulating layer 112. The source electrode 141 and the drain electrode 142 may be connected to the source area and the drain area of the active layer 120, respectively. Each of the source electrode 141 and the drain electrode 142 may include a conductive material such as a metal, an alloy, a conductive metal nitride, a conductive metal oxide, a transparent conductive material, or the like. Each of the source electrode 141 and the drain electrode 142 may have a single-layered structure or a multi-layered structure including a plurality of conductive layers. The active layer 120, the gate electrode 130, the source electrode 141, and the drain electrode 142 may form the transistor TR.

A third insulating layer 113 may be located on the source electrode 141 and the drain electrode 142. The third insulating layer 113 may include an organic insulating material. Examples of the organic insulating material that can be used for the third insulating layer 113 may include a photoresist, a polyacryl-based resin, a polyimide-based resin, a polyamide-based resin, a siloxane-based resin, an acryl-based resin, an epoxy-based resin, or the like. These can be used alone or in a combination thereof. According to some embodiments, the third insulating layer 113 may have a multi-layered structure including at least one organic insulating layer and at least one inorganic insulating layer.

A pixel electrode 151 may be located on the third insulating layer 113. The pixel electrode 151 may be connected to the source electrode 141 or the drain electrode 142. The pixel electrode 151 may include a conductive material such as a metal, an alloy, a conductive metal nitride, a conductive metal oxide, a transparent conductive material, or the like. The pixel electrode 151 may have a single-layered structure or a multi-layered structure including a plurality of conductive layers.

A fourth insulating layer 114 may be located on the pixel electrode 151. The fourth insulating layer 114 may cover a peripheral area of the pixel electrode 151, and may include a pixel opening exposing a central area of the pixel electrode 151. The fourth insulating layer 114 may include an organic insulation material.

An emission layer 152 may be located on the pixel electrode 151. The emission layer 152 may be located in the pixel opening of the fourth insulation layer 114. According to some embodiments, the emission layer 152 may include at least one of an organic light emitting material or quantum dot.

According to some embodiments, the organic light emitting material may include a low molecular organic compound or a high molecular organic compound.

Examples of the low molecular organic compound may include copper phthalocyanine, N,N'-diphenylbenzidine, tris-(8-hydroxyquinoline)aluminum, or the like. Examples of the high molecular organic compound may include poly (3,4-ethylenedioxythiophene), polyaniline, poly-phenylenevinylene, polyfluorene, or the like. These can be used alone or in a combination thereof.

According to some embodiments, the quantum dot may include a core including a Group II-VI compound, a Group III-V compound, a Group IV-VI compound, a Group IV element, and/or a Group IV compound. According to some embodiments, the quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

The counter electrode 153 may be located on the emission layer 152. The counter electrode 153 may also be located on the fourth insulating layer 114. The counter electrode 153 may include a conductive material such as a metal, an alloy, a conductive metal nitride, a conductive metal oxide, a transparent conductive material, or the like. The counter electrode 153 may have a single-layered structure or a multi-layered structure including a plurality of conductive layers. The pixel electrode 151, the emission layer 152, and the counter electrode 153 may form the light emitting element 150.

The encapsulation layer 160 may be located on the counter electrode 153. The encapsulation layer 160 may include at least one inorganic encapsulation layer and at least one organic encapsulation layer. According to some embodiments, the encapsulation layer 160 may include a first inorganic encapsulation layer 161 located on the counter electrode 153, an organic encapsulation layer 162 located on the first inorganic encapsulation layer 161, and a second inorganic encapsulation layer 163 located on the organic encapsulation layer 162.

According to some embodiments, the driving circuit chip 210 may be located in the second area 2A on the display panel 100. The FPCB 220 may be located on an end portion of the second area 2A (e.g., an end portion in the first direction DR1). That is, the FPCB 220 may be spaced apart from the driving circuit chip 210 in the first direction DR1. In addition, a printed circuit board ("PCB") may be connected to an end portion of the FPCB 220. According to some embodiments, the driving circuit chip 210 may be located on the FPCB 220.

The driving circuit chip 210, the FPCB 220, and the PCB may provide a driving signal to the display panel 100. The driving signal may include various signals for driving the display panel 100 such as driving voltage, a gate signal, a data signal, or the like.

The polarization layer 300 may be located in the first area 1A on the display panel 100. The polarization layer 300 may reduce reflection of external light of the display device 10. For example, when the external light having passed through the polarization layer 300 is reflected from a lower portion of the polarization layer 300 (e.g., an upper portion of the display panel 100) and then passes through the polarization layer 300 again, a phase of the reflected external light may be changed as the incoming external light passes through the polarization layer 300 twice. As a result, the phase of reflected external light may be different from the phase of the incoming external light entering the polarization layer 300 to the extent that a destructive interference occurs. Accordingly, the reflection of external light may be reduced to increase visibility of the display device 10.

An adhesive layer 512 may be located between the display panel 100 and the polarization layer 300. The adhesive layer 512 may attach the polarization layer 300 to the upper surface 101 of the display panel 100. For example, the adhesive layer 512 may include may include any of an optical clear adhesive (OCA), a pressure sensitive adhesives (PSA), or an optical clear resin (OCR) including an acryl-based adhesives, a silicon-based adhesives, a urethane-based adhesives, a rubber-based adhesives, a vinyl ether-based adhesives, or the like.

The bending protection layer 400 may be located on the display panel 100. The bending protection layer 400 may cover the bending area BA on the upper surface 101 of the display panel 100. According to some embodiments, the bending protection layer 400 may cover a portion of the first area 1A (e.g., an end portion in the first direction DR1), the bending area BA, and a portion of the second area 2A (e.g., an end portion in a direction opposite to the first direction DR1).

The bending protection layer 400 may protect the bending area BA of the display panel 100. For example, the bending protection layer 400 may protect a conductive layer in the bending area BA of the display panel 100. Wires for transmitting the driving signal to the display panel 100 may be located in the conductive layer. When a stacked structure is bent, there is a stress neutral plane in the stacked structure. If the bending protection layer 400 is omitted, an excessive tensile stress may be applied, when the display panel 100 is bent, to the conductive layer in the bending area BA because the conductive layer may not be in the stress neutral plane. However, the bending protection layer 400 may be formed on the bending area BA, and the thickness and modulus of elasticity of the bending protection layer 400 may be controlled so that the location of the stress neutral plane in the stack structure including the display panel 100, the bending protection layer 400, or the like. The location of the stress neutral plane may be around the conductive layer by forming the bending protection layer 400. Accordingly, tensile stress applied to the conductive layer may be minimized. In addition, the bending protection layer 400 may protect the bending area BA of the display panel 100 from static electricity introduced from the outside.

According to some embodiments, the bending protection layer 400 may include a pre-formed bending protection layer 410 and a post-formed bending protection layer 420. The pre-formed bending protection layer 410 may be formed before the post-formed bending protection layer 420. The post-formed bending protection layer 420 may include a first post-formed bending protection layer 422 and a second post-formed bending protection layer 424.

The pre-formed bending protection layer 410 may be spaced apart from the polarization layer 300 in the first direction DR1. According to some embodiments, at least a portion of the pre-formed bending protection layer 410 may overlap the bending area BA. That is, the pre-formed bending protection layer 410 may cover or overlap at least a portion of the bending area BA on the upper surface 101 of the display panel 100.

According to some embodiments, as illustrated in FIG. 1, the pre-formed bending protection layer 410 may extend in the second direction DR2. In addition, an upper surface of the pre-formed bending protection layer 410 may have a rounded shape.

The pre-formed bending protection layer 410 may include a curable material. The curable material may include a photo-curable material or a thermo-curable material. The photo-curable material may include an ultraviolet (UV) curable resin. Examples of the photo-curable material may include an epoxy acrylate resin, a polyester acrylate resin, a urethane acrylate resin, a polyether acrylate resin, a silicone acrylate resin, an alkyl acrylate resin, or the like. Examples of the thermo-curable material may include an epoxy resin, a phenol resin, an urea resin, a melamine resin, a polyurethane resin, or the like. These can be used alone or in a combination thereof.

The first post-formed bending protection layer 422 may be located between the polarization layer 300 and the pre-formed bending protection layer 410. According to some embodiments, at least a portion of the post-formed bending protection layer 422 may overlap the first area 1A. That is, the first post-formed bending protection layer 422 may cover a portion of the first area 1A on the upper surface 101 of the display panel 100. As illustrated in FIG. 1, the first post-formed bending protection layer 422 may extend in the second direction DR2.

According to some embodiments, the first post-formed bending protection layer 422 may directly contact the polarization layer 300 and the pre-formed bending protection layer 410. For example, a first end portion of the first post-formed bending protection layer 422 adjacent to the polarization layer 300 may directly contact a sidewall of the polarization layer 300. The first end portion of the first post-formed bending protection layer 422 adjacent to the polarization layer 300 may cover a portion of an upper surface of the polarization layer 300. A second end portion of the first post-formed bending protection layer 422 adjacent to the pre-formed bending protection layer 410 and opposite to the first end portion may cover a portion of the upper surface of the pre-formed bending protection layer 410. That is, an edge 422a of the first post-formed bending protection layer 422 contacting the pre-formed bending protection layer 410 may extend in the second direction DR2 and may be positioned on the upper surface of the pre-formed bending protection layer 410.

The second post-formed bending protection layer 424 may be positioned in the first direction DR1 of the pre-formed bending protection layer 410. For example, the second post-formed bending protection layer 424 may be spaced apart from the first post-formed bending protection layer 422 in the first direction DR1 with the pre-formed bending protection layer 410 interposed therebetween. That is, the post-formed bending protection layer 420 may expose a portion of the upper surface of the pre-formed bending protection layer 410. According to some embodiments, at least a portion of the second post-formed bending protection layer 424 may overlap the second area 2A. That is, the second post-formed bending protection layer 424 may cover a portion of the second area 2A on the upper surface 101 of the display panel 100. As illustrated in FIG. 1, the second post-formed bending protection layer 424 may extend in the second direction DR2.

According to some embodiments, the second post-formed bending protection layer 424 may directly contact the pre-formed bending protection layer 410. For example, a first end portion of the second post-formed bending protection layer 424 adjacent to the pre-formed bending protection layer 410 may cover a portion of the upper surface of the pre-formed bending protection layer 410. That is, an edge 424a of the second post-formed bending protection layer 424 contacting the pre-formed bending protection layer 410 may extend in the second direction DR2 and may be positioned on the upper surface of the pre-formed bending protection layer 410. As illustrated in FIG. 1, the edge 424a of the second post-formed bending protection layer 424 may be spaced apart from the edge 422a of the first post-formed bending protection layer 422 in the first direction DR1.

According to some embodiments, as illustrated in FIG. 4, a second end portion of the second post-formed bending protection layer 424 adjacent to the driving circuit chip 210 and opposite to the first end portion may be spaced apart from the driving circuit chip 210. That is, the second post-formed bending protection layer 424 may not cover the driving circuit chip 210 and the FPCB 220.

According to some embodiments, as illustrated in FIG. 6, the second end portion of the second post-formed bending protection layer 424 may cover at least a portion of the driving circuit chip 210. In addition, the second end portion of the second post-formed bending protection layer 424 may further cover a portion of the FPCB 220. In this case, the second post-formed bending protection layer 424 may prevent or reduce separation of the driving circuit chip 210 and/or the FPCB 220 from the display panel 100.

Each of the first and second post-formed bending protection layers 422 and 424 may include a curable material. The curable material may include a photo-curable material or a thermo-curable material. The first and second post-formed bending protection layers 422 and 424 may include a substantially same material.

According to some embodiments, the first and second post-formed bending protection layers 422 and 424 may include a substantially same material as the pre-formed bending protection layer 410. For example, each of the pre-formed bending protection layer 410, the first post-formed bending protection layer 422, and the second post-formed bending protection layer 424 may include a photo-curable material. For another example, each of the pre-formed bending protection layer 410, the first post-formed bending protection layer 422, and the second post-formed bending protection layer 424 may include a thermo-curable material.

According to some embodiments, the first and second post-formed bending protection layers 422 and 424 may include a different material from the pre-formed bending protection layer 410. For example, the pre-formed bending protection layer 410 may include a photo-curable material, and the first and second post-formed bending protection layers 422 and 424 may include a thermo-curable material. According to some embodiments, the pre-formed bending protection layer 410 may include a thermo-curable material, and the first and second post-formed bending protection layers 422 and 424 may include a photo-curable material. For still another example, the pre-formed bending protection layer 410 may include a material including a photo-curable functional group and a thermo-curable functional group, and the first and second post-formed bending protection layers 422 and 424 may include a photo-curable material (or, a thermo-curable material).

According to some embodiments, as illustrated in FIG. 4, an average distance D1 between a lower surface 102 of the display panel 100 and an upper surface of the bending protection layer 400 may be less than an average distance D2 between the lower surface 102 of the display panel 100 and the upper surface of the polarization layer 300. That is, the bending protection layer 400 may have a relatively small thickness T. For example, the thickness T of the bending protection layer 400 (e.g., an average thickness of the bending protection layer 400) may be determined according to a bending radius of the display panel 100. For example, in order to reduce the bending radius of the display panel 100, it may be necessary to form the bending protection layer 400 to have a relatively small thickness. In addition, in order to effectively protect the bending area BA of the display panel 100, it may be necessary to form the bending protection layer 400 to have a uniform thickness.

When a curable material is entirely applied on the display panel 100 to form a curable material layer and the curable material layer is cured to form the bending protection layer 400 at once, an uniformity of the thickness T of the bending protection layer 400 may be reduced. For example, the curable material layer before curing may have fluidity. As will be described in more detail later with reference to FIG. 8, a first surface tension ST1 caused by the polarization layer 300 and a second surface tension ST2 caused by the curable material layer itself may act on the curable material layer. Accordingly, a portion of the curable material layer that is closer to the polarization layer 300 may be drawn toward the polarization layer 300 by the first surface tension ST1. Another portion of the curable material layer that is far from the polarization layer 300 may be drawn toward a central portion of the curable material layer by the second surface tension ST2. Accordingly, before the curable material layer is cured, a thickness of a portion of the curable material layer formed in an area where the first surface tension ST1 and the second surface tension ST2 overlap (e.g., a first forming area FA1 of FIG. 8) may be reduced. Accordingly, the uniformity of the thickness T of the bending protection layer 400 may be reduced. For example, as the thickness T of the bending protection layer 400 decreases, the uniformity may be further reduced.

According to some embodiments, the pre-formed bending protection layer 410 spaced apart from the polarization layer 300 in the first direction DR1 may be formed first on the display panel 100. The pre-formed bending protection layer 410 may be formed by applying a curable material to an area spaced apart from the polarization layer 300 in the first direction DR1 (e.g., an area where the first surface tension ST1 and the second surface tension ST2 overlap) to form a curable material layer, and then immediately pre-curing the curable material layer. Accordingly, it may be possible to prevent or reduce a thickness of the curable material layer formed in the area where the first surface tension ST1 and the second surface tension ST2 overlap from being reduced by the first surface tension ST1 and the second surface tension ST2 before the curable material layer is cured. At least a portion of the pre-formed bending protection layer 410 may overlap the bending area BA. After the pre-formed bending protection layer 410 is formed, the post-formed bending protection layer 420 including the first and second post-formed bending protection layers 422 and 424 may be formed on both sides of the pre-formed bending protection layer 410. Accordingly, even when the bending protection layer 400 is formed on the display panel 100 to have the relatively small thickness T, the thickness T of the bending protection layer 400 may be generally uniform. Accordingly, the conductive layer in the bending area BA of the display panel 100 may be effectively protected, and a reliability of the display device 10 may be improved.

The panel protection layer 520 may be arranged under the display panel 100. The panel protection layer 520 may absorb an external impact from a lower portion of the display device 10 to protect the display panel 100.

According to some embodiments, the panel protection layer 520 may include a first panel protection layer 522 overlapping the first area 1A and a second panel protection layer 524 overlapping the second area 2A. The second panel protection layer 524 may be spaced apart from the first panel protection layer 522 in the first direction DR1. Accordingly, an opening OP may be formed between the first and second panel protection layers 522 and 524. The opening OP may overlap the bending area BA. The opening OP may prevent or reduce the panel protection layer 520 from peeling off the lower surface 102 of the display panel 100 as the display panel 100 is bent.

The cushion layer 530 may be located under the panel protection layer 520. The cushion layer 530 may be located under the display panel 100 to reduce an external impact applied to the display panel 100. For example, the cushion layer 530 may include an acrylic resin, a polyurethane, a thermoplastic polyurethane, a latex, a polyurethane foam, a polystyrene foam, or the like. The cushion layer 530 may be formed as a foam or gel.

The metal layer 540 may be located under the cushion layer 530. The metal layer 540 may support the display panel 100. In addition, when the display device 10 is a foldable display device that can be folded or unfolded in a folding area, a plurality of holes overlapping the folding area may be formed in the metal layer 540. Accordingly, even if the display device 10 is repeatedly folded or unfolded, the folding area of the display device 10 may not be damaged.

According to some embodiments, adhesive layers may be located between the display panel 100 and the panel protection layer 520, between the panel protection layer 520 and the cushion layer 530, and between the cushion layer 530 and the metal layer 540, respectively.

According to some embodiments, the cushion layer 530 and the metal layer 540 may be located under the first panel protection layer 522. That is, the cushion layer 530 and the metal layer 540 may not overlap the bending area BA. In addition, a spacer may be located under the metal layer 540. That is, the spacer may be located between the metal layer 540 and the second panel protection layer 524 overlapping each other while the display panel 100 is bent (refer to FIG. 5).

According to some embodiments, a filling member 600 may be located in the opening OP formed between the first and second panel protection layers 522 and 524. The filling member 600 may include a photo-curable material or a thermo-curable material. The filling member 600 may be cured after the display panel 100 is bent. Accordingly, the filling member 600 may prevent or reduce deformation of the display panel 100 by a restoring force to return to a non-bent state.

Figure 7:
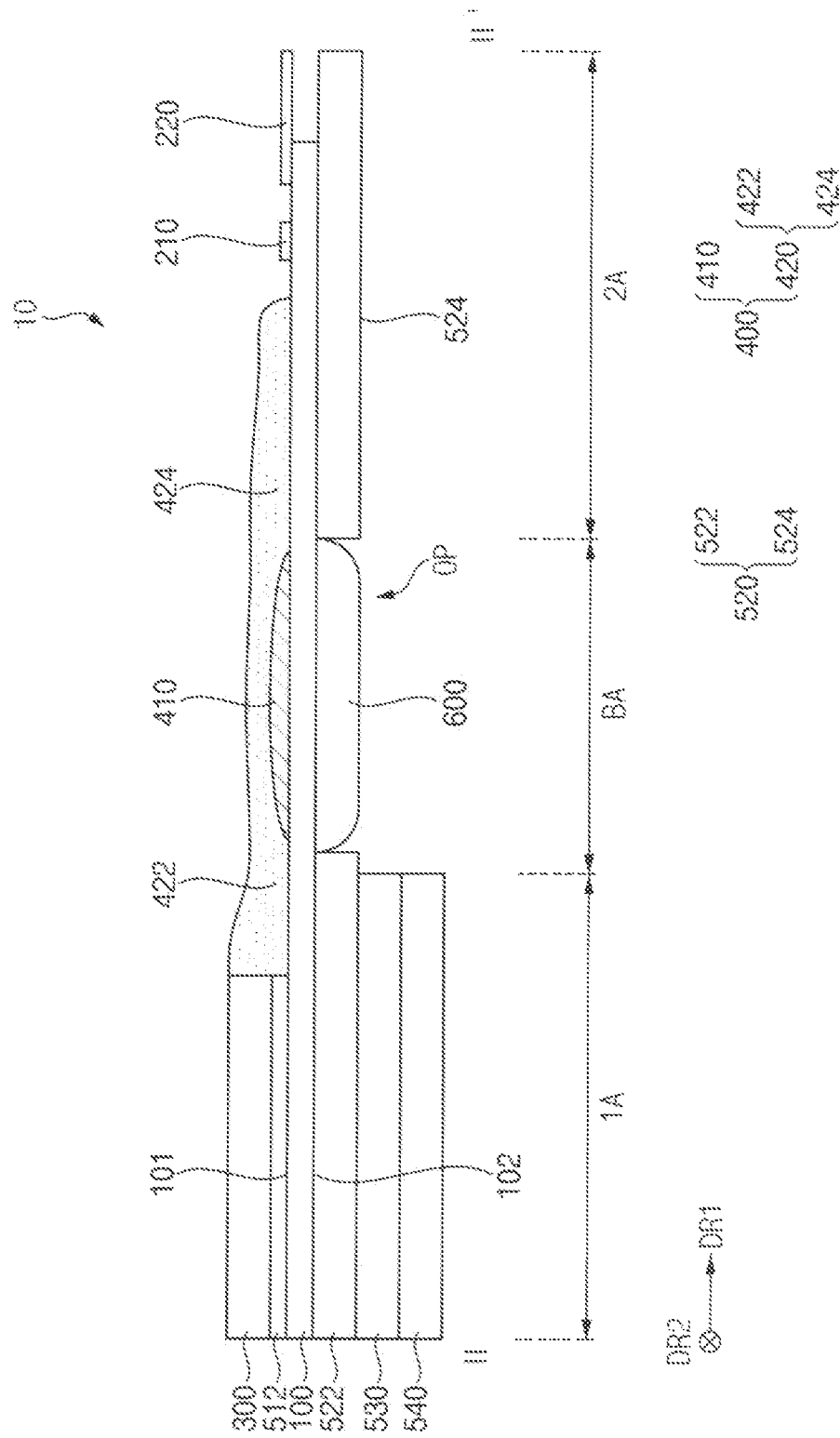
FIG. 7 is a cross-sectional view illustrating still another example taken along the line II-II' of FIG. 1.

FIG. 7 is a cross-sectional view illustrating further details according to some embodiments taken along the line II-II' of FIG. 1.

Referring to FIG. 7, according to some embodiments, the post-formed bending protection layer 420 may entirely cover the pre-formed bending protection layer 410. That is, the first post-formed bending protection layer 422 and the second post-formed bending protection layer 424 illustrated in FIG. 4 may be integrally formed.

According to some embodiments, the pre-formed bending protection layer 410 may be formed to have a thickness less than a target thickness of the bending protection layer 400. Subsequently, the post-formed bending protection layer 420 may be formed to cover the pre-formed bending protection layer 410. A thickness of a portion of the post-formed bending protection layer 420 overlapping the pre-formed bending protection layer 410 may be less than a thickness of another portion of the post-formed bending protection layer 420 not overlapping the pre-formed bending protection layer 410. Accordingly, a thickness of the bending protection layer 400 may be generally uniform.

FIGS. 8 to 14 are cross-sectional views illustrating a method of manufacturing a display device according to some embodiments. For example, FIGS. 8 to 14 may illustrate a method of manufacturing the display device 10 of FIGS. 4 and 5.

Figure 8:
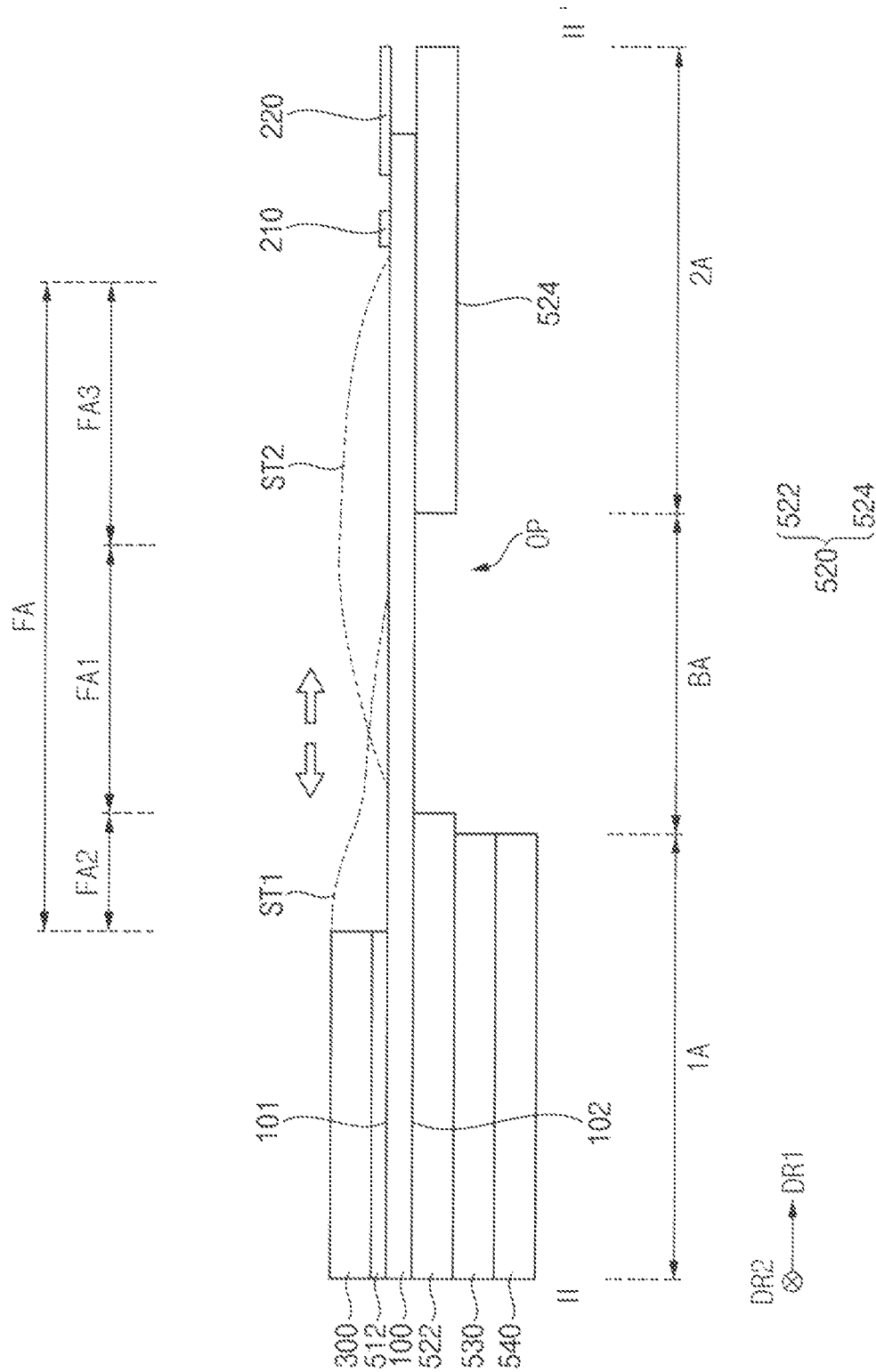
FIGS. 8 to 14 are cross-sectional views illustrating a method of manufacturing a display device according to some embodiments.

Referring to FIG. 8, according to some embodiments, the display panel 100 having the first area 1A, the second area 2A, and the bending area BA may be formed, the panel protection layer 520, the cushion layer 530, and the metal layer 540 may be formed under the display panel 100, and the driving circuit chip 210, the FPCB 220, and the polarization layer 300 may be attached on the display panel 100. Subsequently, the bending protection layer 400 may be formed on the display panel 100. According to some embodiments, the driving circuit chip 210 and the FPCB 220 may be attached on the display panel 100 after the bending protection layer 400 is formed.

The polarization layer 300 may be formed in the first area 1A on the display panel 100. After the polarization layer 300 is formed, the bending protection layer 400 may be formed in a forming area FA on the display panel 100 using a curable material. The forming area FA may be positioned in the first direction DR1 of the polarization layer 300. The forming area FA may overlap the bending area BA. The forming area FA may further overlap a portion of the first area 1A and a portion of the second area 2A.

According to some embodiments, the forming area FA may include first to third forming areas FA1, FA2, and FA3. The first forming area FA1 may be spaced apart from the polarization layer 300 in the first direction DR1. The second forming area FA2 may be positioned between the first forming area FA1 and the polarization layer 300. The third forming area FA3 may be positioned in the first direction DR1 of the first forming area FA1. The third forming area FA3 may be spaced apart from the second forming area FA2 with the first forming area FA1 interposed therebetween. The first forming area FA1 may overlap the bending area BA. The second forming area FA2 may overlap the first area 1A. The third forming area FA3 may overlap the second area 2A.

As described above, according to some embodiments, it may be necessary to form the bending protection layer 400 to have a relatively small and uniform thickness. When a curable material is entirely applied in the forming area FA on the display panel 100 to form a curable material layer and the curable material layer is cured to form the bending protection layer 400 at once, an uniformity of the thickness of the bending protection layer 400 may be reduced. For example, the curable material layer before curing may have fluidity. In addition, a first surface tension ST1 caused by the polarization layer 300 and a second surface tension ST2 caused by the curable material layer itself may act on the curable material layer. Accordingly, a portion of the curable material layer that is closer to the polarization layer 300 may be drawn toward the polarization layer 300 by the first surface tension ST1. Another portion of the curable material layer that is far from the polarization layer 300 may be drawn toward a central portion of the curable material layer by the second surface tension ST2. Accordingly, before the curable material layer is cured, a thickness of a portion of the curable material layer formed in the first forming area FA1 where the first surface tension ST1 and the second surface tension ST2 overlap may be reduced. Accordingly, the uniformity of the thickness of the bending protection layer 400 may be reduced. For example, as the thickness of the bending protection layer 400 decreases, the uniformity may be further reduced.

Accordingly, in order to form the bending protection layer 400 having a uniform thickness, the pre-formed bending protection layer 410 may be first formed in the first forming area FA1, and then the first and second post-formed bending protection layers 422 and 424 may be formed in the second and third forming areas FA2 and FA3, respectively.

Figure 9:
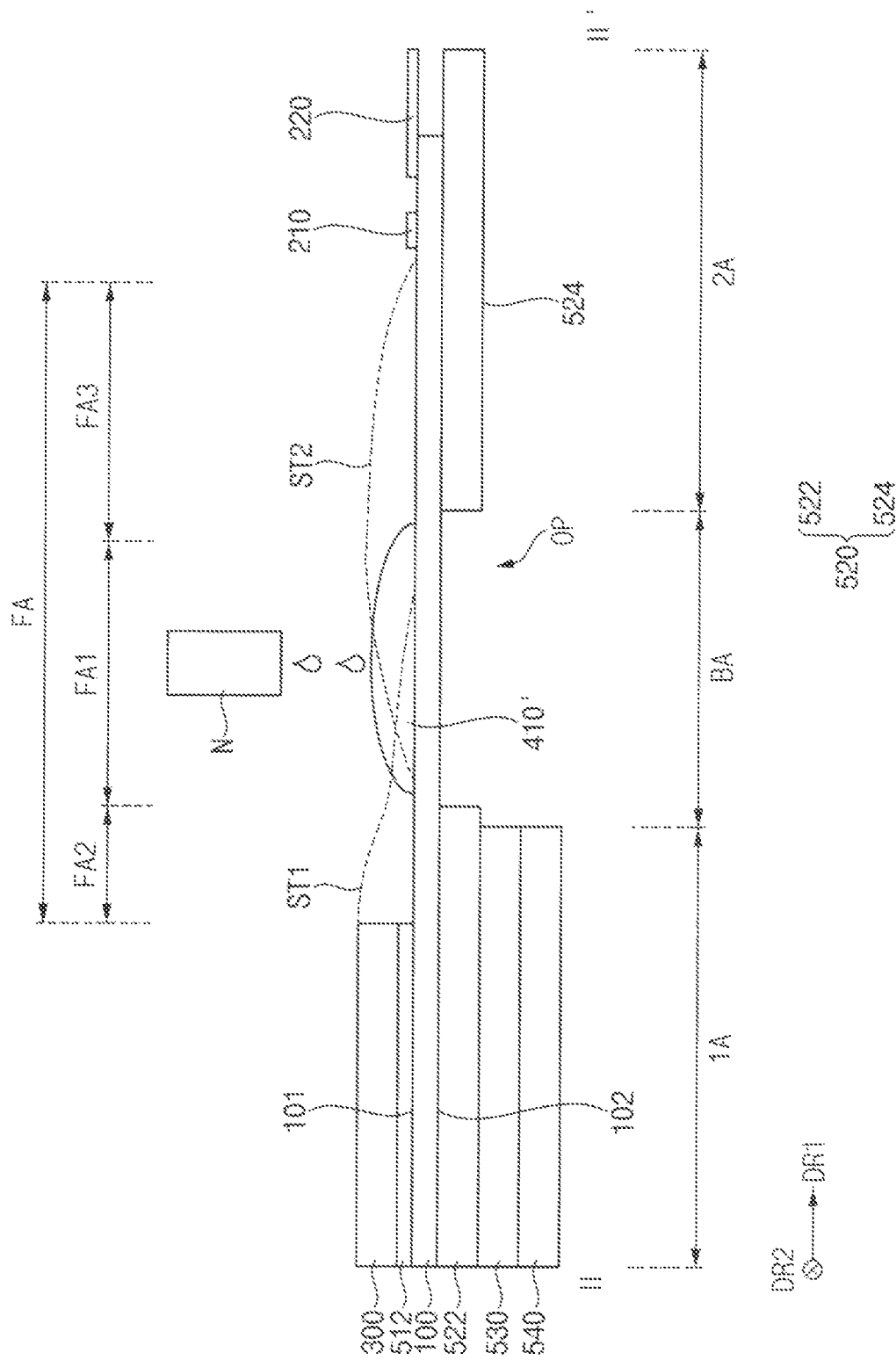
Figure 10:
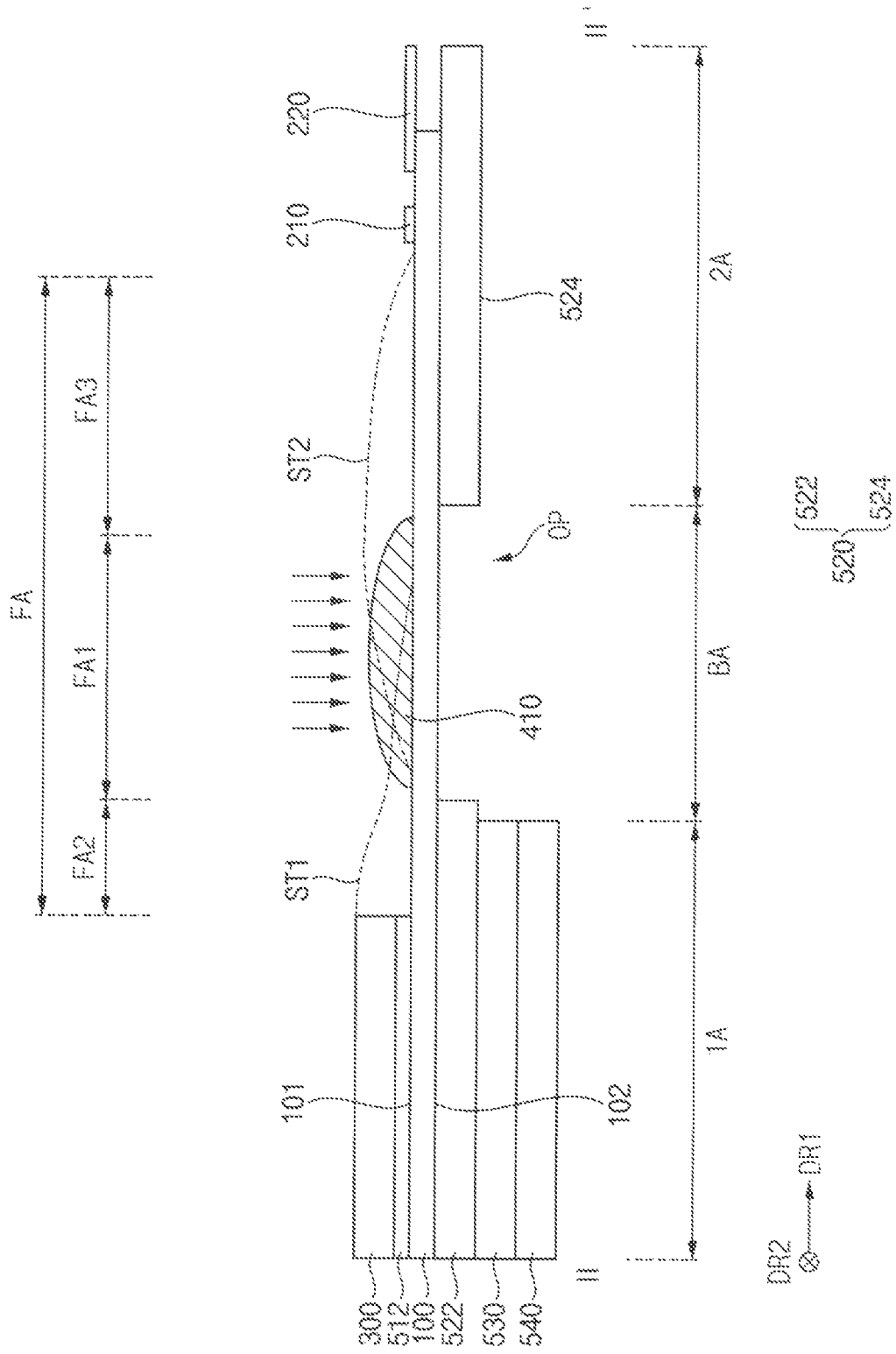

Referring to FIGS. 9 to 10, the pre-formed bending protection layer 410 may be formed in the first forming area FA1 on the display panel 100 to be spaced apart from the polarization layer 300 in the first direction DR1. At least a portion of the pre-formed bending protection layer 410 may overlap the bending area BA.

First, referring to FIG. 9, a first curable material layer 410' may be formed by applying a first curable material to the first forming area FA1 on the display panel 100. For example, the first curable material layer 410' may be formed by partially applying the first curable material to the first forming area FA1 on the display panel 100 using a nozzle N. The first curable material may include a photo-curable material or a thermo-curable material.

Subsequently, referring to FIG. 10, the first curable material layer 410' formed in the first forming area FA1 may be pre-cured to form the pre-formed bending protection layer 410. The first curable material layer 410' may be pre-cured by light (e.g., UV) or heat depending on a type of the first curable material.

According to some embodiments, the first curable material layer 410' may be pre-cured by light or heat immediately after being formed in the first forming area FA1 on the display panel 100. For example, after the first curable material layer 410' is formed by applying the first curable material on the display panel 100 by the nozzle N, the first curable material layer 410' may be immediately pre-cured by applying light or heat to the first curable material layer 410' using a curing apparatus connected to the nozzle N. Accordingly, because a time from the formation of the first curable material layer 410' to the pre-curing is reduced, it may be possible to prevent or reduce a thickness of the pre-formed bending protection layer 410 from being reduced by the first surface tension ST1 and the second surface tension ST2.

Figure 11:
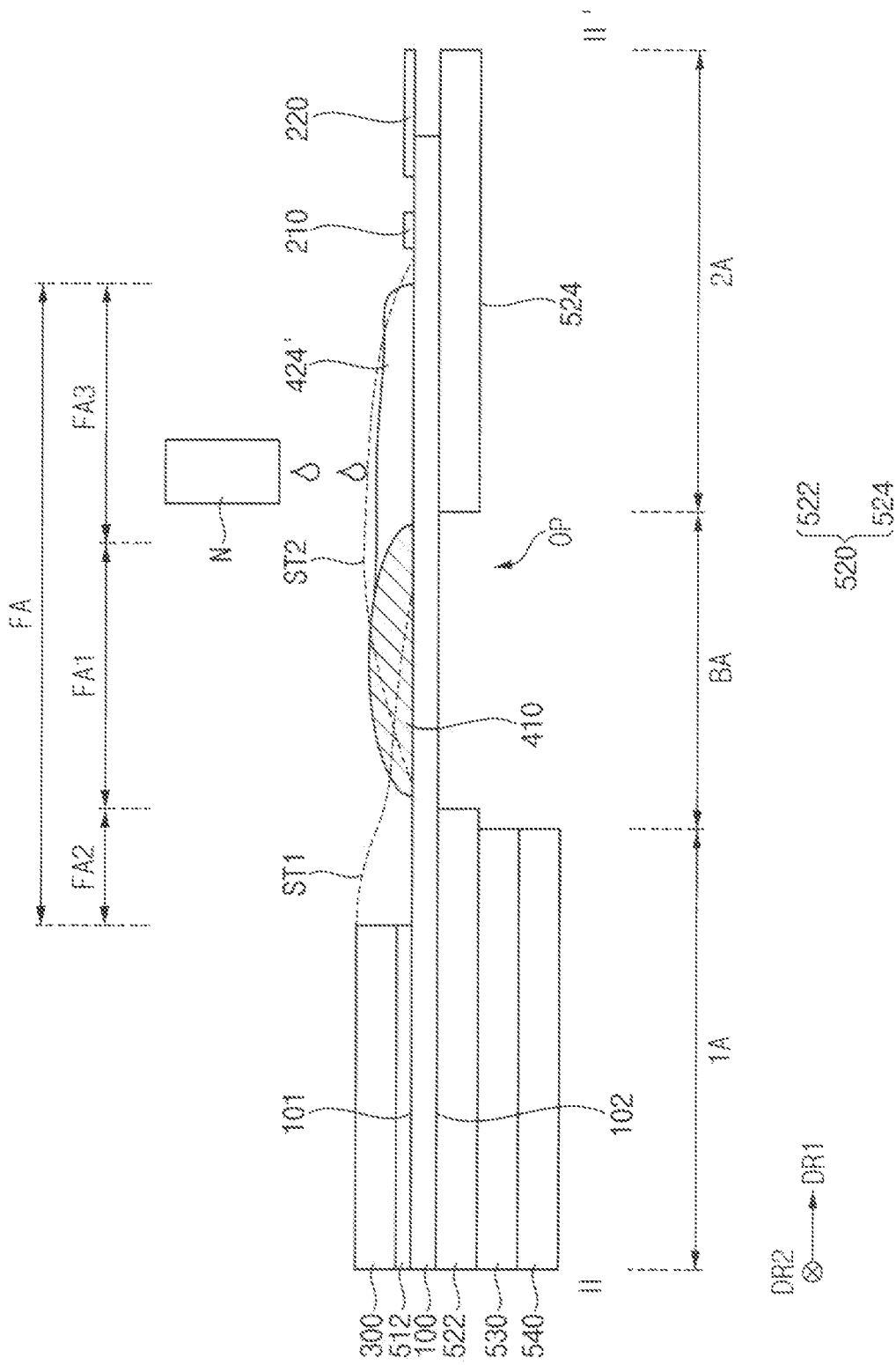
Figure 12:
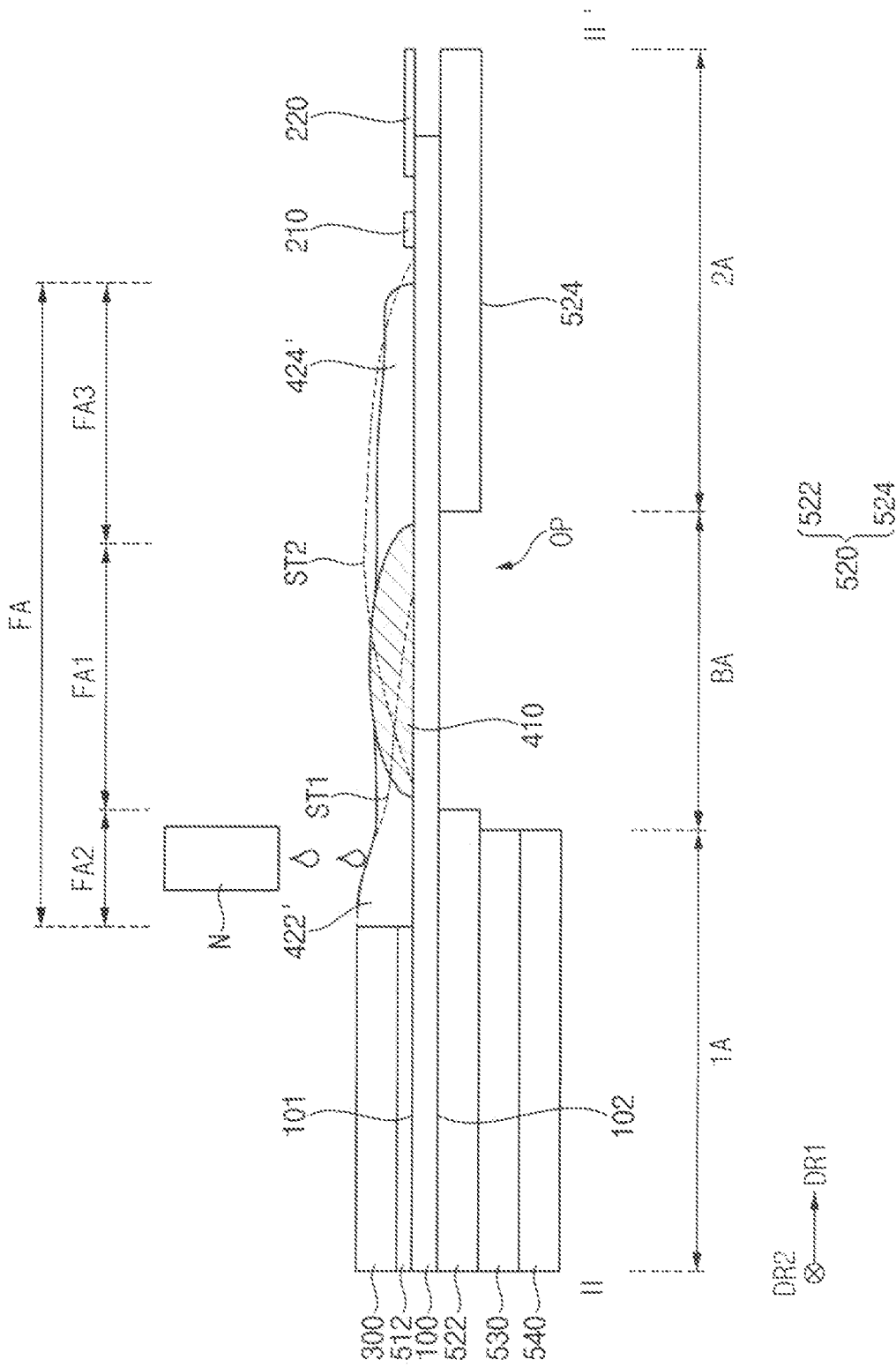
Figure 13:
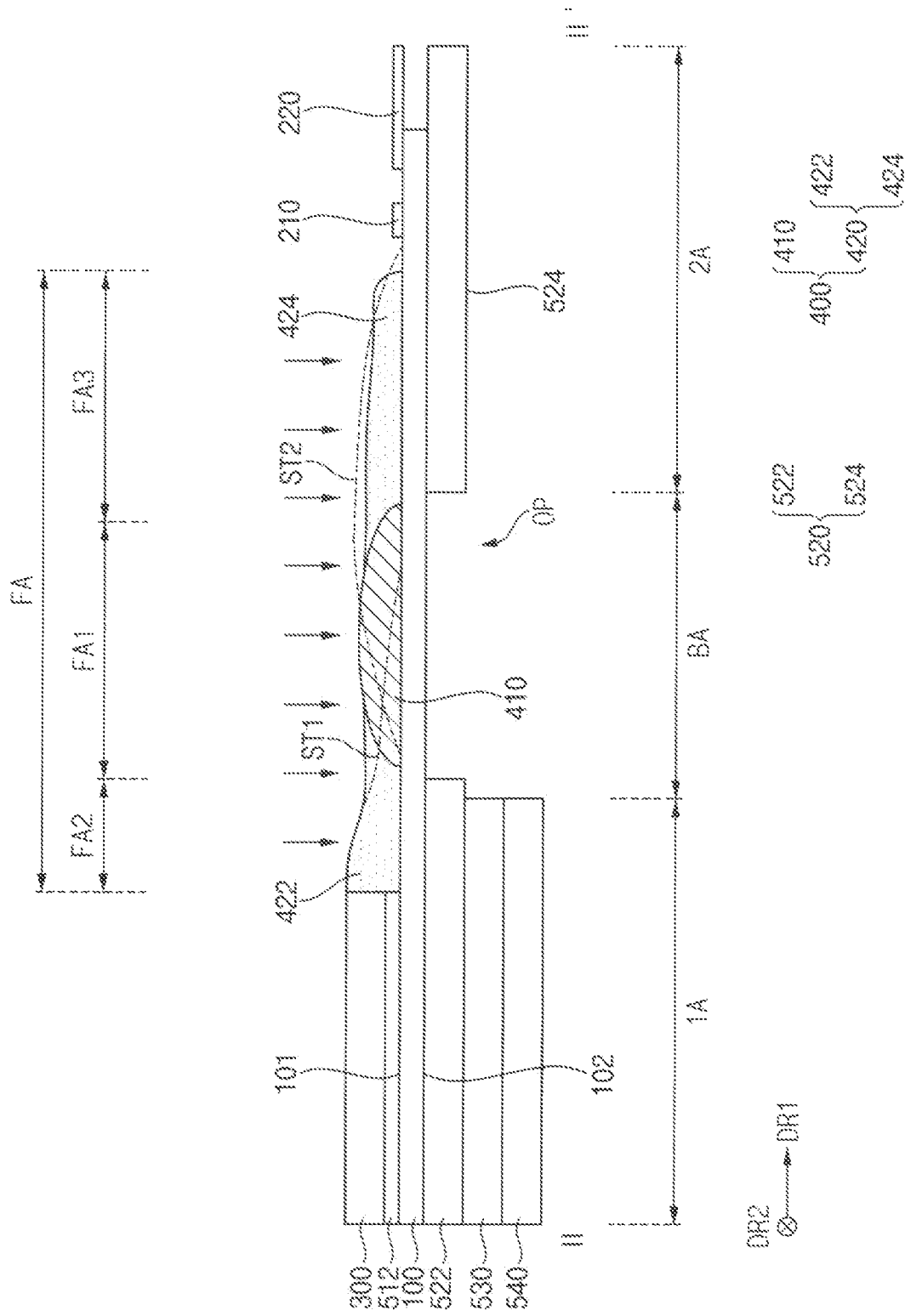

Referring to FIGS. 11 to 13, after the pre-formed bending protection layer 410 is formed, the post-formed bending protection layer 420 including the first and second post-formed bending protection layers 422 and 424 may be formed. The first and second post-formed bending protection layers 422 and 424 may be formed in the second and third forming areas FA2 and FA3 on the display panel 100, respectively.

A second curable material layer 422' and a third curable material layer 424' may be formed by applying a second curable material to the second forming area FA2 and the third forming area FA3 on the display panel 100, respectively. Subsequently, the second curable material layer 422' and the third curable material layer 424' may be cured to form the first and second post-formed bending protection layers 422 and 424.

According to some embodiments, referring to FIG. 11, the third curable material layer 424' may be formed before the second curable material layer 422'. For example, the third curable material layer 424' may be formed by partially applying the second curable material to the third forming area FA3 on the display panel 100 using the nozzle N. The second curable material may include a photo-curable material or a thermo-curable material. According to some embodiments, the second curable material may be same as the first curable material used to form the first curable material layer 410'. According to some embodiments, the second curable material may be different from the first curable material.

The third curable material layer 424' may be formed in the first direction DR1 of the pre-formed bending protection layer 410. The third curable material layer 424' may directly contact the pre-formed bending protection layer 410. For example, the third curable material layer 424' may cover a portion of the upper surface of the pre-formed bending protection layer 410.

Subsequently, referring to FIG. 12, the second curable material layer 422' may be formed by partially applying the second curable material to the second forming area FA2 on the display panel 100 using the nozzle N.

The second curable material layer 422' may be formed between the polarization layer 300 and the pre-formed bending protection layer 410. The second curable material layer 422' may directly contact each of the polarization layer 300 and the pre-formed bending protection layer 410. For example, a first end portion of the second curable material layer 422' adjacent to the polarization layer 300 may directly contact the sidewall of the polarization layer 300. The first end portion of the second curable material layer 422' adjacent to the polarization layer 300 may cover a portion of the upper surface of the polarization layer 300. A second end portion of the second curable material layer 422' adjacent to the pre-formed bending protection layer 410 and opposite to the first end portion may cover a portion of the upper surface of the pre-formed bending protection layer 410.

Each of the second curable material layer 422' and the third curable material layer 424' may extend in the second direction DR2. According to some embodiments, the second curable material layer 422' may be spaced apart from the third curable material layer 424' with the pre-formed bending protection layer 410 interposed therebetween. That is, the second and third curable material layers 422' and 424' may expose a portion of the upper surface of the pre-formed bending protection layer 410.

Subsequently, referring to FIG. 13, the second and third curable material layers 422' and 424' may be cured to form the post-formed bending protection layer 420 including the first and second post-formed bending protection layers 422 and 424. The second and third curable material layers 422' and 424' may be cured by light or heat depending on a type of the second curable material.

According to some embodiments, when the second curable material layer 422' is formed later than the third curable material layer 424', a time from the formation of the second curable material layer 422' to the curing may be reduced. Accordingly, the second curable material layer 422' may be less drawn toward the polarization layer 300 by the first surface tension ST1. Accordingly, it may be possible to minimize or reduce a difference in thickness of the first post-formed bending protection layer 422.

According to some embodiments, the pre-cured pre-formed bending protection layer 410 may be additionally cured during the second and third curable material layers 422' and 424' are cured. For example, when the first curable material and the second curable material both include a photo-curable material, the pre-cured pre-formed bending protection layer 410 may be additionally cured during the second and third curable material layers 422' and 424' are cured by light. For another example, when the first curable material includes photo-curable functional group and a thermo-curable functional group and the second curable material includes a photo-curable material, the pre-cured pre-formed bending protection layer 410 may be additionally cured during the second and third curable material layers 422' and 424' are cured by light. In this case, the first curable material layer 410' may be pre-cured by heat and additionally cured by light. However, this is merely an example, and embodiments according to the present disclosure are not limited thereto.

Figure 14:
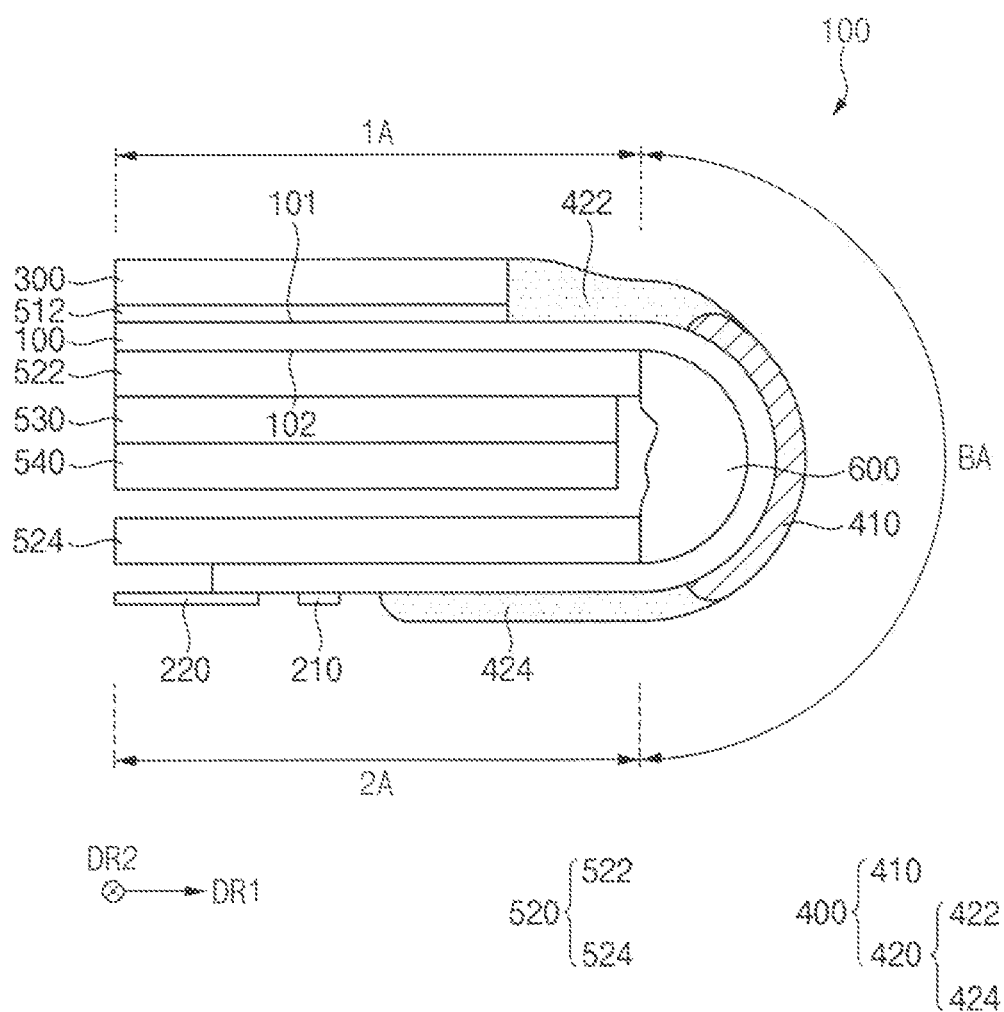

Referring to FIG. 14, the display panel 100 may be bent. The bending area BA of the display panel 100 may be bent along the bending axis extending in the second direction DR2. As the display panel 100 is bent, the bending protection layer 400 covering the bending area BA on the display panel 100 may be bent together.

The filling member 600 may be formed in the opening OP of the panel protection layer 520 overlapping the bending area BA under the display panel 100. According to some embodiments, the filling member 600 may be formed before the display panel 100 is bent, and may be cured after the display panel 100 is bent. According to some embodiments, the filling member 600 may be injected into the opening OP after the display panel 100 is bent and then cured.

According to some embodiments, the pre-formed bending protection layer 410 may be formed first in the first forming area FA1 spaced apart from the polarization layer 300 in the first direction DR1 on the display panel 100. The pre-formed bending protection layer 410 may be formed by applying the first curable material to the first forming area FA1 to form the first curable material layer 410', and then immediately pre-curing the first curable material layer 410'. Accordingly, it may be possible to prevent or reduce a thickness of the first curable material layer 410' formed in the first forming area FA1 where the first surface tension ST1 and the second surface tension ST2 overlap from being reduced by the first surface tension ST1 and the second surface tension ST2 before the first curable material layer 410' is cured. At least a portion of the pre-formed bending protection layer 410 may overlap the bending area BA. After the pre-formed bending protection layer 410 is formed, the post-formed bending protection layer 420 including the first and second post-formed bending protection layers 422 and 424 may be formed on both sides of the pre-formed bending protection layer 410. Accordingly, even when the bending protection layer 400 is formed on the display panel 100 to have a relatively small thickness, the thickness of the bending protection layer 400 may be generally uniform. Accordingly, the conductive layer in the bending area BA of the display panel 100 may be effectively protected, and the reliability of the display device 10 may be improved.

Figure 15:
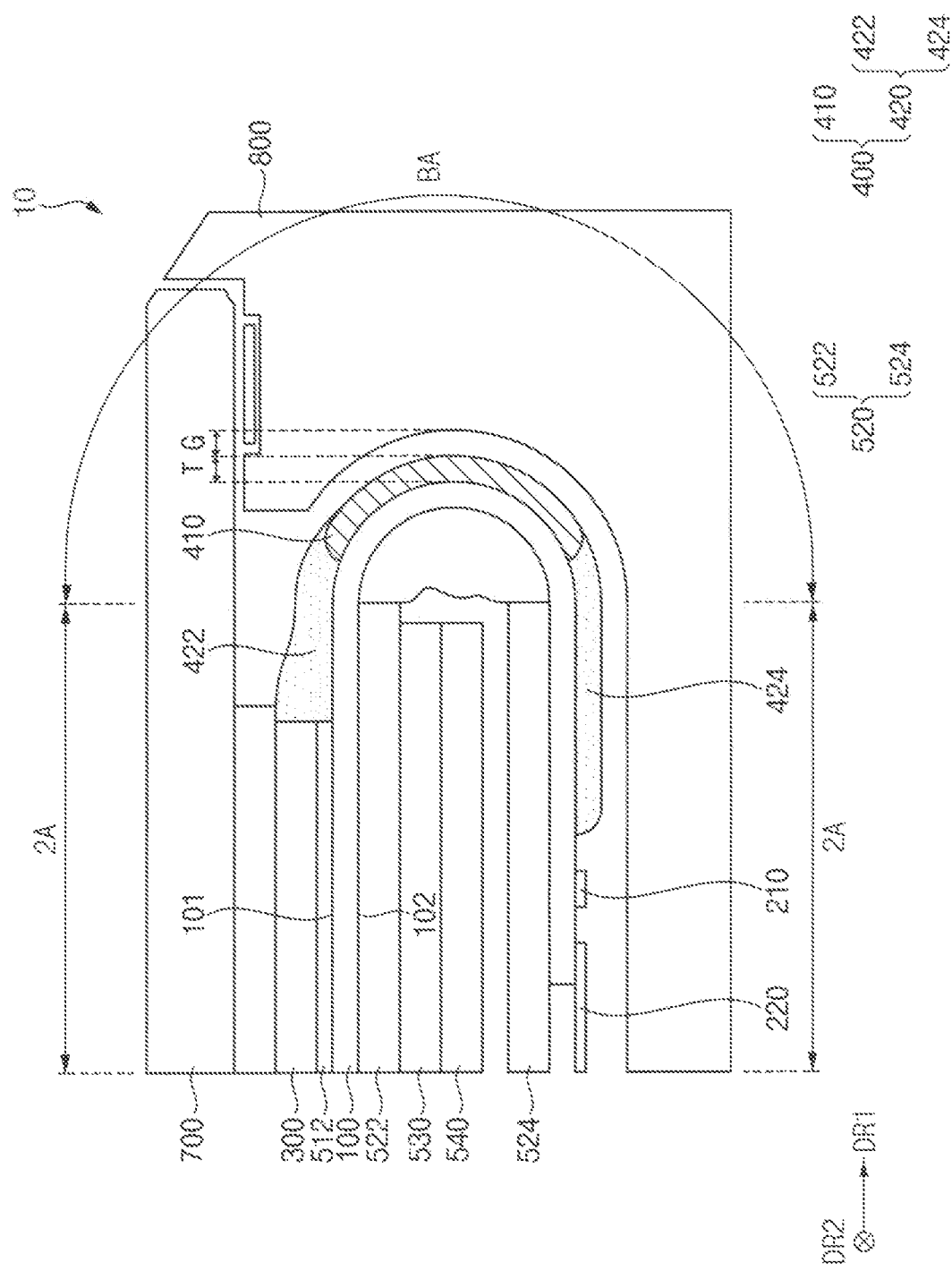
FIG. 15 is a cross-sectional view illustrating a display device according to some embodiments.

FIG. 15 is a cross-sectional view illustrating a display device according to some embodiments.

Referring to FIG. 15, according to some embodiments, the display device 10 may further include a cover glass 700 and a set bracket 800.

The cover glass 700 may be arranged on the polarization layer 300. The cover glass 700 may be attached on the polarization layer 300 by an adhesive layer 514. The cover glass 700 may protect the display panel 100 from external impurities, impact, or the like. The cover glass 700 may include a transparent glass, a transparent plastic, or the like.

The set bracket 800 may accommodate the display panel 100, the polarization layer 300, and the like. The set bracket 800 may protect the display panel 100 from external impurities, impact, or the like. According to some embodiments, an inner sidewall of the set bracket 800 may have a shape corresponding to the bent display panel 100 and the bending protection layer 400. The inner sidewall of the set bracket 800 may be spaced apart from the adjacent bending protection layer 400 while maintaining a predetermined gap G. According to some embodiments, as the thickness T of the bending protection layer 400 is reduced, the gap G between the set bracket 800 and the bending protection layer 400 may increase. Accordingly, the reliability of the display device 10 may be improved.

Figure 16:
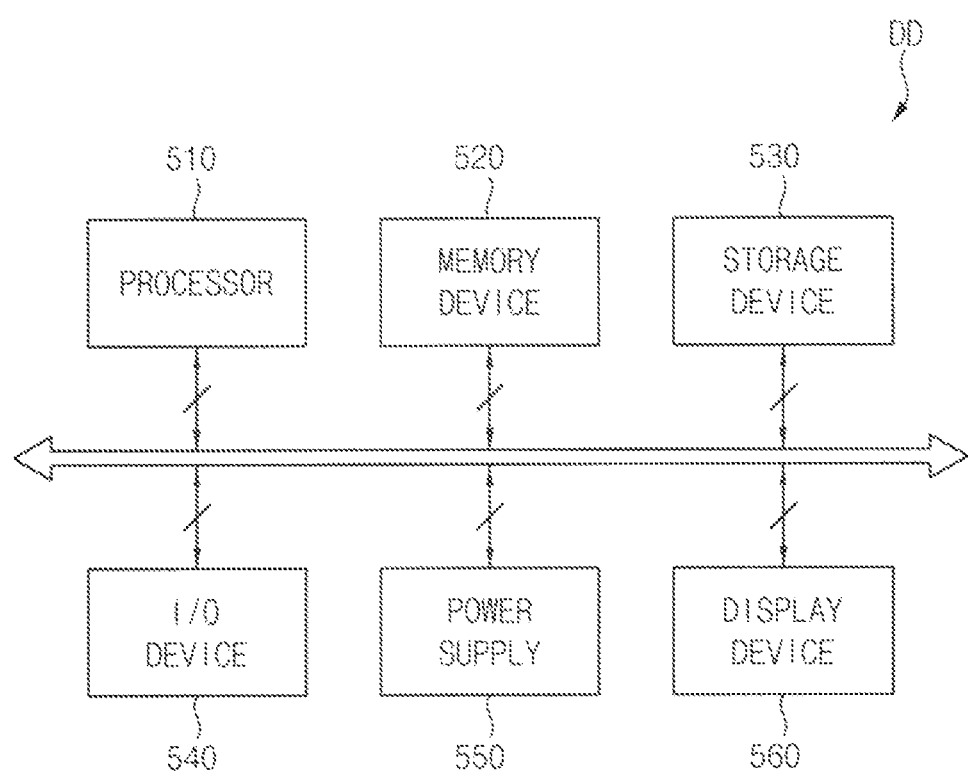
FIG. 16 is a block diagram illustrating an electronic device according to some embodiments.
Figure 17:
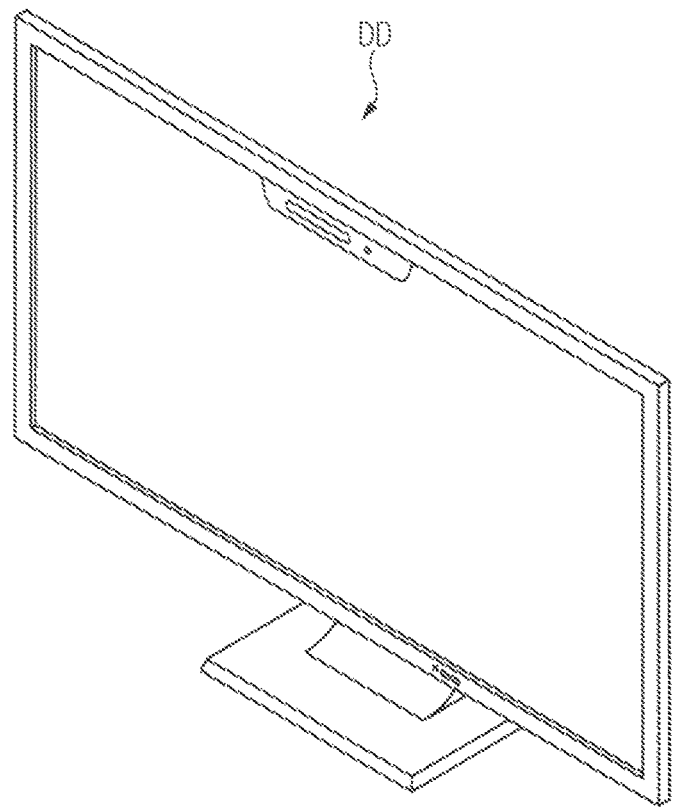
FIG. 17 is a diagram illustrating an example in which the electronic device of FIG. 16 is implemented as a television.
Figure 18:
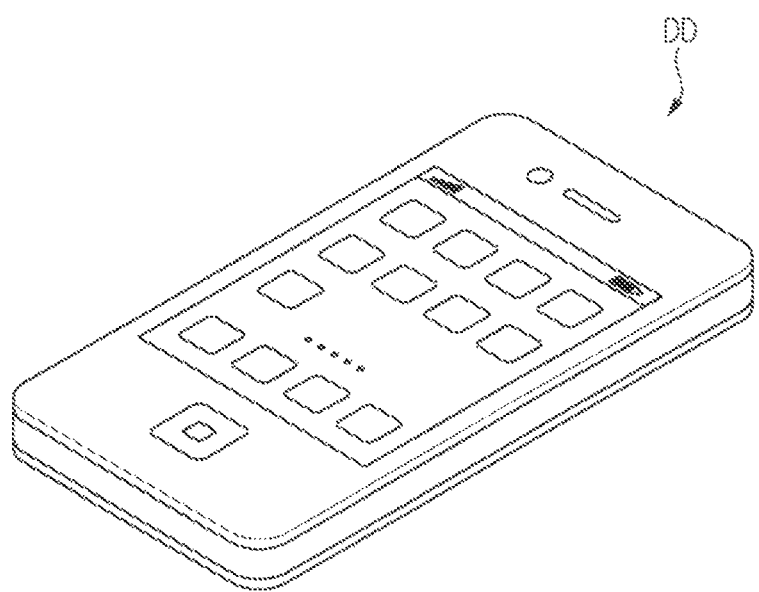
FIG. 18 is a diagram illustrating an example in which the electronic device of FIG. 16 is implemented as a smart phone.

FIG. 16 is a block diagram illustrating an electronic device according to some embodiments. FIG. 17 is a diagram illustrating an example in which the electronic device of FIG. 16 is implemented as a television. FIG. 18 is a diagram illustrating an example in which the electronic device of FIG. 16 is implemented as a smart phone.

Referring to FIGS. 16 to 18, according to some embodiments, an electronic device DD may include a processor 910, a memory device 920, a storage device 930, an input/output ("I/O") device 940, a power supply 950, and a display device 960. Here, the display device 960 may correspond to the display device 10 described with reference to FIGS. 1 to 8. The electronic device DD may further include a plurality of ports for communicating with a video card, a sound card, a memory card, a universal serial bus ("USB") device, or the like. According to some embodiments, as illustrated in FIG. 17, the electronic device DD may be implemented as a television. According to some embodiments, as illustrated in FIG. 18, the electronic device DD may be implemented as a smart phone. However, embodiments according to the present disclosure are not limited thereto, and according to some embodiments, the electronic device DD may be implemented as a cellular phone, a video phone, a smart pad, a smart watch, a tablet personal computer ("PC"), a car navigation system, a computer monitor, a laptop, a head wearable or mounted display ("HMD"), or the like.

The processor 910 may perform various computing functions. According to some embodiments, the processor 910 may be a microprocessor, a central processing unit ("CPU"), an application processor ("AP"), or the like. The processor 910 may be coupled to other components via an address bus, a control bus, a data bus, or the like. According to some embodiments, the processor 910 may be coupled to an extended bus such as a peripheral component interconnection ("PCI") bus.

The memory device 920 may store data for operations of the electronic device DD. According to some embodiments, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

According to some embodiments, the storage device 930 may include a solid state drive ("SSD") device, a hard disk drive ("HDD") device, a CD-ROM device, or the like. According to some embodiments, the I/O device 940 may include an input device such as a keyboard, a keypad, a mouse device, a touchpad, a touch-screen, or the like, and an output device such as a printer, a speaker, or the like.

The power supply 950 may provide power for operations of the electronic device DD. The display device 960 may be coupled to other components via the buses or other communication links. According to some embodiments, the display device 960 may be included in the I/O device 940.

Although certain embodiments and implementations have been described herein, other embodiments and modifications will be apparent from this description. Accordingly, the inventive concepts are not limited to such embodiments, but rather to the broader scope of the appended claims and their equivalents, and various obvious modifications and equivalent arrangements are included within the scope of embodiments according to the present disclosure.

What is claimed is:

1. A method of manufacturing a display device comprising:
    forming a display panel having a first area, a second area spaced apart from the first area in a first direction, and a bending area between the first area and the second area;
    forming a polarization layer in the first area on the display panel;
    forming a pre-formed bending protection layer on the display panel in the bending area, wherein the pre-formed bending protection layer is spaced apart from the polarization layer in the first direction; and
    forming a post-formed bending protection layer on the display panel wherein the post-formed bending protection layer includes a first post-formed bending protection layer between the polarization layer and the pre-formed bending protection layer and at least partially overlapping the pre-formed bending protection layer in the bending area, and a second post-formed bending protection layer spaced apart from the first post-formed bending protection layer with the pre-formed bending protection layer interposed therebetween and the second post-formed bending protection layer at least partially overlapping the pre-formed bending protection layer in the bending area.

2. The method of claim 1, wherein the forming of the pre-formed bending protection layer includes:
    forming a first curable material layer on the display panel by applying a first curable material to a first forming area spaced apart from the polarization layer in the first direction; and
    forming the pre-formed bending protection layer by pre-curing the first curable material layer.

3. The method of claim 2, wherein the forming of the post-formed bending protection includes:
    forming a second curable material layer and a third curable material layer on the display panel by applying a second curable material to a second forming area between the polarization layer and the first forming area and a third forming area adjacent to the first forming area in the first direction; and
    forming the first post-formed bending protection layer and the second post-formed bending protection layer by curing the second curable material layer and the third curable material layer.

4. The method of claim 3, wherein the third curable material layer is formed before the second curable material layer.

5. The method of claim 3, wherein the second curable material is the same as the first curable material.

6. The method of claim 3, wherein the third curable material layer is spaced apart from the second curable material layer with the pre-formed bending protection layer interposed therebetween.

7. The method of claim 1, wherein at least a portion of the pre-formed bending protection layer overlaps the bending area.

8. The method of claim 1, wherein at least a portion of the first post-formed bending protection layer overlaps the first area, and
    wherein at least a portion of the second post-formed bending protection layer overlaps the second area.

9. The method of claim 1, wherein the first post-formed bending protection layer directly contacts the polarization layer and the pre-formed bending protection layer, and
    wherein the second post-formed bending protection layer directly contacts the pre-formed bending protection layer.

10. The method of claim 1, wherein an average distance between a lower surface of the display panel and an upper surface of a bending protection layer including the pre-formed bending protection layer and the post-formed bending protection layer is less than an average distance between the lower surface of the display panel and an upper surface of the polarization layer.

11. The method of claim 1, wherein the pre-formed bending protection layer extends in a second direction crossing the first direction.

12. The method of claim 11, wherein an edge of the first post-formed bending protection layer contacting the pre-formed bending protection layer extends in the second direction, and
    wherein an edge of the second post-formed bending protection layer contacting the pre-formed bending protection layer extends in the second direction and is spaced apart from the edge of the first post-formed bending protection layer in the first direction.

* * * * *